(12) United States Patent
Miyazawa et al.

(10) Patent No.: US 12,241,941 B2
(45) Date of Patent: *Mar. 4, 2025

(54) METHOD OF EVALUATING POWER STORAGE DEVICE, METHOD OF MANUFACTURING POWER STORAGE DEVICE, AND TEST SYSTEM

(71) Applicant: TOYOTA JIDOSHA KABUSHIKI KAISHA, Toyota (JP)

(72) Inventors: Kensaku Miyazawa, Toyota (JP); Shinichi Hamasaki, Nagakute (JP); Yuya Ishihara, Miyoshi (JP); Tetsuya Kaneko, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/601,023

(22) Filed: Mar. 11, 2024

(65) Prior Publication Data

US 2024/0219473 A1 Jul. 4, 2024

Related U.S. Application Data

(63) Continuation of application No. 18/295,517, filed on Apr. 4, 2023, which is a continuation of application
(Continued)

(51) Int. Cl.
*G01R 31/385* (2019.01)
*G01R 31/3842* (2019.01)
(Continued)

(52) U.S. Cl.
CPC ..... *G01R 31/3865* (2019.01); *G01R 31/3842* (2019.01); *G01R 31/385* (2019.01);
(Continued)

(58) Field of Classification Search
CPC ............... G01R 31/3865; G01R 31/50; G01R 31/3842; G01R 31/388; H02J 7/0069; H01M 10/4285; H01M 10/44
See application file for complete search history.

(56) References Cited

U.S. PATENT DOCUMENTS 7,968,221 B2 6/2011 Hatanaka et al.
8,663,832 B2 3/2014 Abe et al.
(Continued)

FOREIGN PATENT DOCUMENTS

CN 103813932 A 5/2014
JP 2010-250954 A 11/2010
(Continued)

OTHER PUBLICATIONS

Miyazawa, Kensaku et al., U.S. Appl. No. 16/900,232, filed Jun. 12, 2020.
(Continued)

*Primary Examiner* — Stephanie E Bloss
*Assistant Examiner* — Michael A Harrison
(74) *Attorney, Agent, or Firm* — Sughrue Mion, PLLC

(57) ABSTRACT

A method of evaluating an all-solid-state battery includes preparing the all-solid-state battery. A charge level of the all-solid-state battery is adjusted to produce a first potential difference between a positive electrode and a negative electrode. The positive electrode or the negative electrode is selected as a reference electrode. After the charge level is adjusted, an operation to insert a conductive rod-shaped member into a stack portion along a direction of stack of the positive electrode and the negative electrode is performed while a second potential difference between the reference electrode and the rod-shaped member is measured. The rod-shaped member is stopped. The all-solid-state battery is
(Continued)

evaluated based on a state of the all-solid-state battery after the rod-shaped member is stopped.

13 Claims, 25 Drawing Sheets

Related U.S. Application Data

No. 17/224,340, filed on Apr. 7, 2021, now Pat. No. 11,650,260, which is a continuation of application No. 16/900,232, filed on Jun. 12, 2020, now Pat. No. 11,002,799, which is a continuation of application No. 16/197,571, filed on Nov. 21, 2018, now Pat. No. 10,725,119.

(51) Int. Cl.
*G01R 31/388* (2019.01)
*G01R 31/50* (2020.01)
*H01M 10/42* (2006.01)
*H01M 10/44* (2006.01)
*H02J 7/00* (2006.01)

(52) U.S. Cl.
CPC ........ *G01R 31/50* (2020.01); *H01M 10/4285* (2013.01); *H01M 10/44* (2013.01); *H02J 7/0069* (2020.01); *G01R 31/388* (2019.01)

(56) References Cited

U.S. PATENT DOCUMENTS

| | | | |
|---|---|---|---|
| 9,935,344 | B2 | 4/2018 | Sawanishi et al. |
| 10,725,119 | B2 | 7/2020 | Miyazawa et al. |
| 11,002,799 | B2 | 5/2021 | Miyazawa |
| 11,650,260 | B2 * | 5/2023 | Miyazawa ......... G01R 31/3842 324/432 |
| 2011/0068800 | A1 | 3/2011 | Nishino et al. |
| 2020/0028145 | A1 * | 1/2020 | Kano ................ H01M 10/0565 |
| 2020/0309862 | A1 | 10/2020 | Miyazawa |
| 2023/0236255 | A1 | 7/2023 | Miyazawa |

FOREIGN PATENT DOCUMENTS

| | | |
|---|---|---|
| JP | 2016-018722 A | 2/2016 |
| JP | 2017-117628 A | 6/2017 |
| KR | 10-2011-0021970 A | 3/2011 |
| WO | 2013041929 A1 | 3/2013 |
| WO | 2018158955 A1 | 9/2018 |

OTHER PUBLICATIONS

Notice of Allowance dated Jan. 11, 2023, issued in U.S. Appl. No. 17/224,340.
Office Action dated Sep. 18, 2020, issued in U.S. Appl. No. 16/900,232.
Notice of Allowance dated Jan. 13, 2021, issued in U.S. Appl. No. 16/900,232.
Notice of Allowance dated Mar. 25, 2020, issued in U.S. Appl. No. 16/197,571.
Corrected Notice of Allowability dated May 20, 2020, issued in U.S. Appl. No. 16/197,571.
Miyazawa, Kensaku et al., U.S. Appl. No. 17/224,340, filed Apr. 7, 2021.
Miyazawa, Kensaku et al., U.S. Appl. No. 16/197,571, filed Nov. 21, 2018.
Miyazawa, Kensaku et al., U.S. Appl. No. 18/295,517, filed Apr. 4, 2023.
Office Action dated Dec. 19, 2023, issued in U.S. Appl. No. 18/295,517.
United States Office Action dated Sep. 25, 2024 in U.S. Appl. No. 18/295,517.
Office Action issued Jul. 8, 2024 in U.S. Appl. No. 18/295,517.
Notice of Allowance dated Nov. 22, 2024 in U.S. Appl. No. 18/295,517.

\* cited by examiner

FIG.1
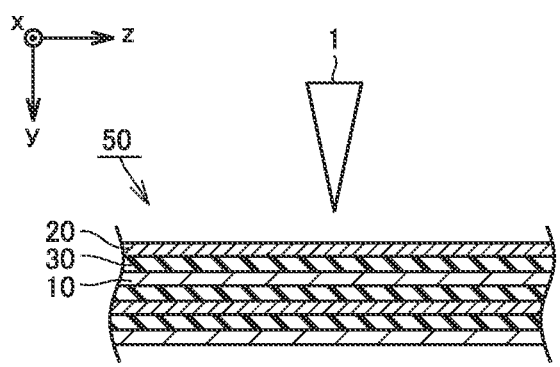
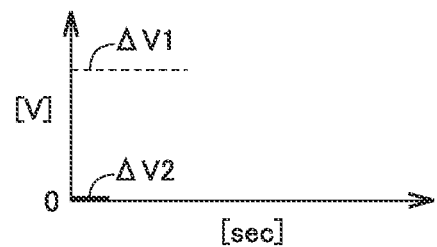

FIG.2
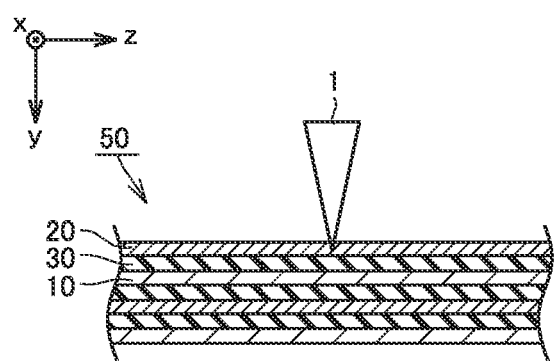
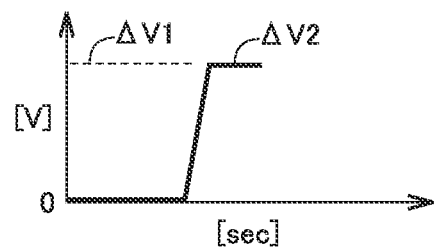

FIG.3
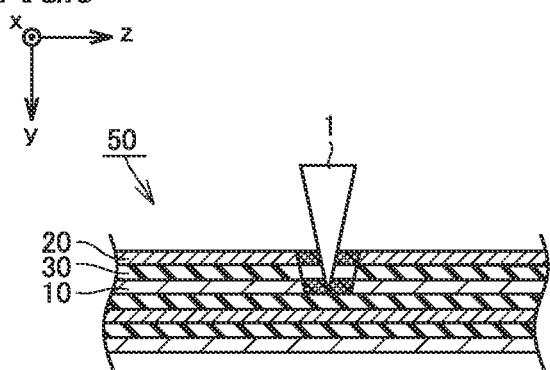
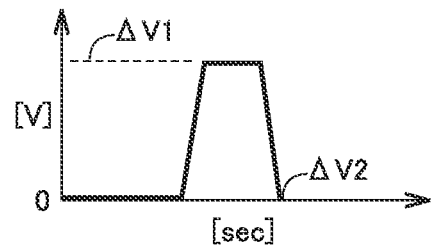

FIG.4
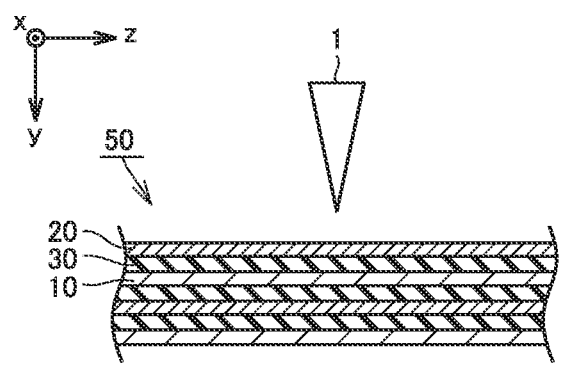
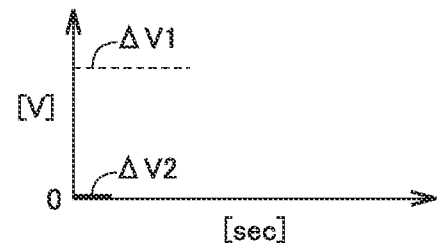

FIG.5
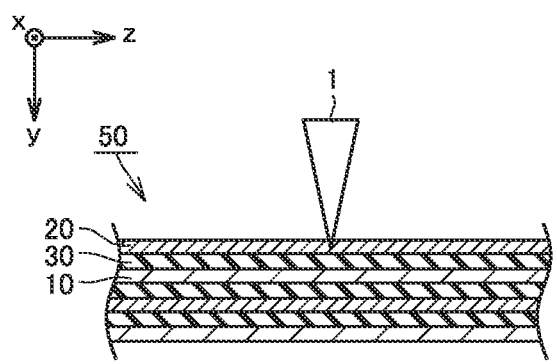
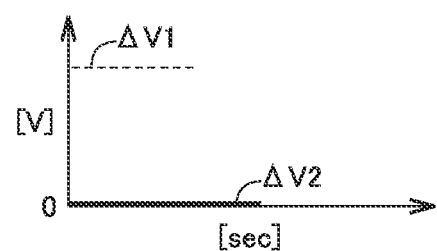

FIG.6
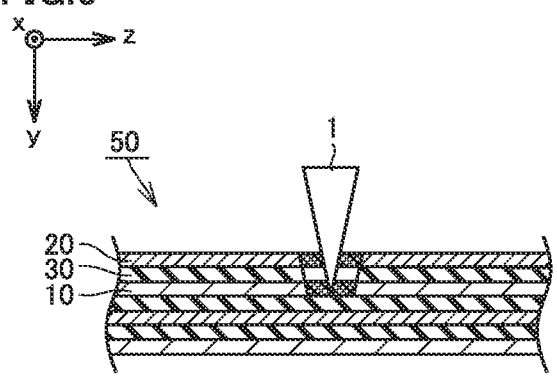
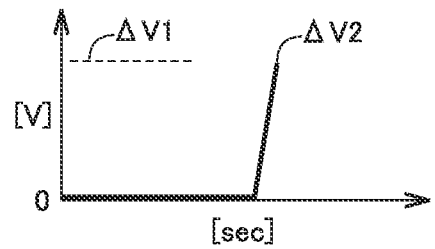

FIG.7
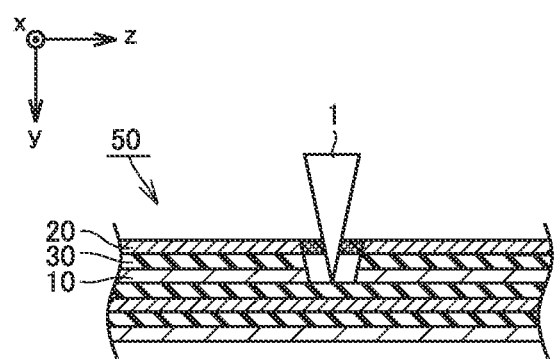
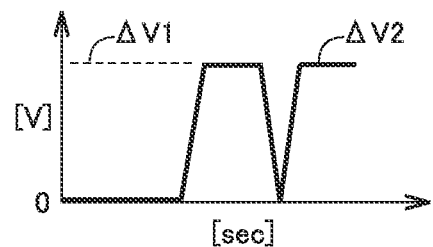
OUTERMOST ELECTRODE ≠ REFERENCE ELECTRODE

FIG.8
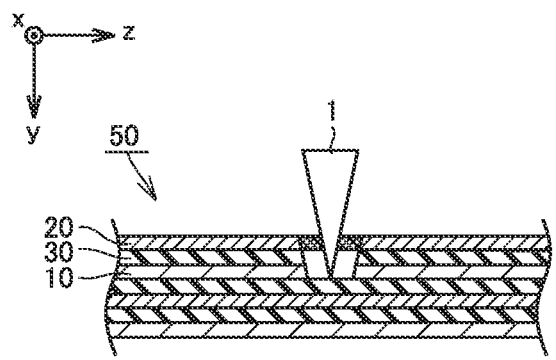
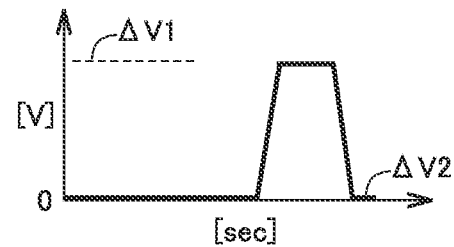

METHOD OF EVALUATING POWER STORAGE DEVICE, METHOD OF MANUFACTURING POWER STORAGE DEVICE, AND TEST SYSTEM

This is a continuation of U.S. application Ser. No. 18/295,517, filed on Apr. 4, 2023, which is a continuation of U.S. application Ser. No. 17/224,340 filed Apr. 7, 2021 (now U.S. Pat. No. 11,650,260 issued May 16, 2023) which is a continuation of U.S. application Ser. No. 16/900,232 filed Jun. 12, 2020 (now U.S. Pat. No. 11,002,799 issued May 11, 2021), which is a continuation of U.S. application Ser. No. 16/197,571, filed Nov. 21, 2018 (now U.S. Pat. No. 10,725,119 issued Jul. 28, 2020), which is based on Japanese Patent Application No. 2017-229128 filed with the Japan Patent Office on Nov. 29, 2017, the entire contents of which are hereby incorporated by reference.

BACKGROUND

Field

The present disclosure relates to a method of evaluating a power storage device, a method of manufacturing a power storage device, and a test system.

Description of the Background Art

Japanese Patent Laying-Open No. 2010-250954 discloses an evaluation method of forcibly causing internal short-circuiting in a power storage device by inserting into the power storage device, a prescribed evaluation jig to a depth where internal short-circuiting occurs.

SUMMARY

A method of evaluating which state a power storage device reaches (for example, a battery or a capacitor) when internal short-circuiting occurs due to a conductive foreign matter (for example, a metal piece) in the power storage device has been demanded.

"5.5 Forced internal short circuit test of cells" in "JIS C 8714 safety tests for portable lithium ion secondary cells and batteries for use in portable electronic applications" has been known as a simulation test for internal short-circuiting due to a conductive foreign matter.

In the forced internal short circuit test, a charged battery is disassembled and an electrode assembly is taken out of a casing of the battery. A small nickel piece (a conductive foreign matter) is inserted into the electrode assembly. The electrode assembly includes a stack portion which is formed by alternately stacking at least one positive electrode and at least one negative electrode. The small nickel piece is arranged between a positive electrode and a negative electrode located on an outermost side of the stack portion. The small nickel piece causes local internal short-circuiting.

Local internal short-circuiting is desirably short-circuiting between one positive electrode and one negative electrode (which is also denoted as "short-circuiting between single layers" below), because short-circuiting between single layers is considered to occur when a conductive foreign matter is actually introduced in a power storage device.

In the forced internal short circuit test, short-circuiting between single layers tends to occur. In the forced internal short circuit test, however, a prescribed dry room is required for performing an operation to disassemble a power storage device. In addition, high skills are also required for the operation to disassemble the charged power storage device.

Japanese Patent Laying-Open No. 2010-250954 has proposed a test alternative to the forced internal short circuit test. In this publication, a prescribed evaluation jig is used. The evaluation jig is such a jig that a conductive member is provided at a tip end of an insulating rod. The evaluation jig is inserted into the power storage device from the outside of the power storage device to a depth where internal short-circuiting is caused. An evaluation method in the publication is easier in operation than the forced internal short circuit test and is considered as being able to cause local internal short-circuiting as in the forced internal short circuit test.

In Japanese Patent Laying-Open No. 2010-250954, a voltage of a power storage device (a potential difference between the positive electrode and the negative electrode) is used as a condition for stopping the evaluation jig. When an amount of lowering in voltage exceeds a threshold value in the power storage device, insertion of the evaluation jig is stopped. Power storage devices, however, can be various in capacity. Inconvenience as below may be caused in the power storage device high in capacity.

As the power storage device is higher in capacity, a ratio of a capacity lost due to local internal short-circuiting to the capacity of the power storage device is lower. Therefore, as the power storage device is higher in capacity, an amount of lowering in voltage due to local internal short-circuiting also becomes smaller. In a power storage device high in capacity, the evaluation jig may have penetrated a plurality of positive electrodes and a plurality of negative electrodes at the time point of lowering in voltage to a detectable extent. Namely, it may be difficult to control the number of electrodes involved with short-circuiting (which is also denoted as "the number of short-circuited layers" below) in the power storage device high in capacity.

An object of the present disclosure is to provide a method of evaluating a power storage device with which the number of short-circuited layers is controllable.

Technical features and functions and effects of the present disclosure will be described below. A functional mechanism of the present disclosure, however, includes presumption. The scope of claims should not be limited by whether or not the functional mechanism is correct.

[1] A method of evaluating a power storage device according to the present disclosure includes at least (a) to (f) below.

(a) A power storage device is prepared. The power storage device includes at least a casing and an electrode assembly. The electrode assembly is accommodated in the casing. The electrode assembly includes a positive electrode and a negative electrode. At least one positive electrode and at least one negative electrode are alternately stacked to form a stack portion in the electrode assembly.

(b) A charge level of the power storage device is adjusted to produce a first potential difference between the positive electrode and the negative electrode.

(c) The positive electrode or the negative electrode is selected as a reference electrode.

(d) After the charge level is adjusted, an operation to insert a conductive rod-shaped member into the stack portion along a direction of stack of the positive electrode and the negative electrode is performed while a second potential difference between the reference electrode and the rod-shaped member is measured.

(e) The rod-shaped member is stopped.

(f) The power storage device is evaluated based on a state of the power storage device after the rod-shaped member is stopped.

When an electrode with which the rod-shaped member comes in contact first in the stack portion is different from the reference electrode, the operation to insert the rod-shaped member is controlled to stop the rod-shaped member when decrease in absolute value of the second potential difference is detected at least once.

When the electrode with which the rod-shaped member comes in contact first in the stack portion is identical to the reference electrode, the operation to insert the rod-shaped member is controlled to stop the rod-shaped member when increase in absolute value of the second potential difference is detected at least once.

According to the present disclosure, a potential difference (a second potential difference) between the reference electrode (the positive electrode or the negative electrode) and the evaluation jig (the conductive rod-shaped member) rather than a voltage of the power storage device (an absolute value of a first potential difference) is measured. The potential difference (the first potential difference and the second potential difference) represents the absolute value thereof unless otherwise specified below.

An example in which the positive electrode is selected as the reference electrode will be described by way of example. The negative electrode may naturally be selected as the reference electrode.

According to the present disclosure, an evaluation method is different between an example in which the electrode with which the rod-shaped member comes in contact first in the stack portion (which is also denoted as an "outermost electrode" below) is different from the reference electrode and another example in which the outermost electrode is identical to the reference electrode. An example in which the outermost electrode is different from the reference electrode will initially be described.

FIG. 1 is a first conceptual diagram for illustrating a method of evaluating a power storage device according to the present disclosure.

FIG. 1 conceptually shows a cross-section in parallel to a direction of stack of a positive electrode 10 and a negative electrode 20 (a direction of a y axis in FIG. 1). A stack portion 50 is formed by alternately stacking at least one positive electrode 10 and at least one negative electrode 20. A separator 30 is arranged between positive electrode 10 and negative electrode 20. In the present disclosure, however, a power storage device without including separator 30 (for example, an all-solid-state battery) is also encompassed as will be described later.

A first potential difference ($\Delta V1$) is produced between positive electrode 10 and negative electrode 20 by adjusting a charge level. Positive electrode 10 is connected to a rod-shaped member 1 with a voltage measurement device being interposed. Rod-shaped member 1 is conductive. Rod-shaped member 1 is not yet in contact with stack portion 50. At this time point, a second potential difference ($\Delta V2$) between positive electrode 10 (reference electrode) and rod-shaped member 1 is 0 V.

FIG. 2 is a second conceptual diagram for illustrating the method of evaluating a power storage device according to the present disclosure.

As rod-shaped member 1 is inserted in stack portion 50, rod-shaped member 1 comes in contact with negative electrode 20 (outermost electrode). The second potential difference ($\Delta V2$) between positive electrode 10 (reference electrode) and rod-shaped member 1 at this time point is considered as being equal to a potential difference between positive electrode 10 and negative electrode 20. Namely, the second potential difference ($\Delta V2$) is considered to increase to a value substantially equal to the first potential difference ($\Delta V1$) as a result of contact of rod-shaped member 1 with negative electrode 20. The voltage measurement device (a voltmeter) has a sufficiently high internal resistance. Therefore, short-circuiting between positive electrode 10 and negative electrode 20 via the voltage measurement device can be considered as substantially not occurring.

FIG. 3 is a third conceptual diagram for illustrating the method of evaluating a power storage device according to the present disclosure.

As rod-shaped member 1 is inserted deeper into stack portion 50, rod-shaped member 1 passes through negative electrode 20 and separator 30. Rod-shaped member 1 which has passed through separator 30 comes in contact with positive electrode 10. The second potential difference ($\Delta V2$) between positive electrode 10 (reference electrode) and rod-shaped member 1 at this time point is considered as being equal to a potential difference between positive electrode 10 and positive electrode 10. Namely, the second potential difference ($\Delta V2$) is considered to substantially decrease to 0 V as a result of contact of rod-shaped member 1 with positive electrode 10.

Rod-shaped member 1 is considered to be short-circuiting one negative electrode 20 and one positive electrode 10 to each other at the time point of detection of decrease in second potential difference ($\Delta V2$). Namely, short-circuiting between single layers is considered to have occurred.

An amount of decrease in second potential difference ($\Delta V2$) due to short-circuiting between single layers is considered as not being dependent on a capacity of the power storage device in the present disclosure. Therefore, it is considered that short-circuiting between single layers can be detected in a stable manner even in a power storage device of a high capacity.

It is considered that short-circuiting can be set to short-circuiting between single layers by controlling rod-shaped member 1 to stop at the time point of detection of first decrease in second potential difference ($\Delta V2$). Therefore, a state of the power storage device after rod-shaped member 1 is stopped is considered as being equal to a state of the power storage device on the occurrence of short-circuiting between single layers. The "state" here represents, for example, an appearance, whether a temperature is high or low, or whether a voltage is high or low. It is considered that the power storage device on the occurrence of short-circuiting between single layers can be evaluated based on a state of the power storage device after rod-shaped member 1 is stopped.

Rod-shaped member 1 may be stopped at the time point when decrease exceeding a prescribed amount is observed even though the second potential difference ($\Delta V2$) has not reached 0 V.

It is considered that the number of short-circuited layers can be counted by repeatedly causing short-circuiting between single layers in the present disclosure. By counting the number of short-circuited layers, rod-shaped member 1 can be stopped when a target number of short-circuited layers is reached. Namely, the method of evaluating a power storage device in the present disclosure is considered to be able to control the number of short-circuited layers.

Another example in which the outermost electrode is identical to the reference electrode will now be described.

FIG. 4 is a fourth conceptual diagram for illustrating the method of evaluating a power storage device according to the present disclosure.

Stack portion 50 in FIG. 4 is identical in construction to stack portion 50 in FIG. 1. Negative electrode 20 is the outermost electrode. As negative electrode 20 is selected as the reference electrode, the outermost electrode is identical to the reference electrode.

FIG. 5 is a fifth conceptual diagram for illustrating the method of evaluating a power storage device according to the present disclosure.

As rod-shaped member 1 is inserted in stack portion 50, rod-shaped member 1 comes in contact with negative electrode 20 (outermost electrode). The second potential difference (ΔV2) between negative electrode 20 (reference electrode) and rod-shaped member 1 at this time point is considered as being equal to a potential difference between negative electrode 20 and negative electrode 20. Namely, the second potential difference (ΔV2) is considered to remain substantially at 0 V.

FIG. 6 is a sixth conceptual diagram for illustrating the method of evaluating a power storage device according to the present disclosure.

As rod-shaped member 1 is inserted deeper into stack portion 50, rod-shaped member 1 passes through negative electrode 20 and separator 30. Rod-shaped member 1 which has passed through separator 30 comes in contact with positive electrode 10. The second potential difference (ΔV2) between negative electrode 20 (reference electrode) and rod-shaped member 1 at this time point is considered as being equal to a potential difference between negative electrode 20 and positive electrode 10. Namely, the second potential difference (ΔV2) is considered to increase to a value substantially equal to the first potential difference (ΔV1) as a result of contact of rod-shaped member 1 with positive electrode 10.

Rod-shaped member 1 is considered to be short-circuiting one negative electrode 20 and one positive electrode 10 to each other at the time point of detection of increase in second potential difference (ΔV2). Namely, short-circuiting between single layers is considered to have occurred. Therefore, when the outermost electrode is identical to the reference electrode, short-circuiting between single layers is detected based on increase in second potential difference (ΔV2).

It is considered that short-circuiting can be set to short-circuiting between single layers by controlling rod-shaped member 1 to stop at the time point of detection of first increase in second potential difference (ΔV2). Rod-shaped member 1 may be stopped at the time point when increase exceeding a prescribed amount is observed even though the second potential difference (ΔV2) has not reached the first potential difference (ΔV1).

[2] The rod-shaped member may be inserted into the stack portion from the outside of the casing.

Since it is not necessary to disassemble the power storage device, significant improvement in operation efficiency is expected.

[3] The positive electrode may be selected as the reference electrode.

Though details of a mechanism are unclear, with the positive electrode being selected as the reference electrode, an amount of variation (an amount of decrease or an amount of increase) in second potential difference (ΔV2) tends to be large. Therefore, it is expected that detection of short-circuiting between single layers is facilitated with selection of the positive electrode as the reference electrode.

[4] In the method of evaluating a power storage device described in any one of [1] to [3], the electrode with which the rod-shaped member comes in contact first in the stack portion may be different from the reference electrode.

As described previously, in this case, short-circuiting between single layers can be detected based on decrease in second potential difference (ΔV2).

[5] The method of evaluating a power storage device described in [4] may further include (g) below.

(g) The power storage device is evaluated by detecting increase in absolute value of the second potential difference while the rod-shaped member remains stopped after the rod-shaped member is stopped.

FIG. 7 is a seventh conceptual diagram for illustrating the method of evaluating a power storage device according to the present disclosure.

While rod-shaped member 1 remains stopped after rod-shaped member 1 is stopped, the second potential difference (ΔV2) may increase. This phenomenon is explained as below.

A short-circuiting current flows through rod-shaped member 1 due to short-circuiting between single layers. Joule heat is generated by the short-circuiting current. Joule heat melts and spreads at least one of positive electrode 10 and negative electrode 20. FIG. 7 illustrates how positive electrode 10 melts and spreads. At least one of positive electrode 10 and negative electrode 20 is thus considered to be disconnected from rod-shaped member 1. It is thus considered that propagation of the short-circuiting current is suppressed. This phenomenon is also denoted as "fusing" below.

It is considered that, when positive electrode 10 and rod-shaped member 1 are disconnected from each other owing to fusing, the second potential difference (ΔV2) increases to the potential difference between positive electrode 10 and negative electrode 20 at that time point. It is considered that, since rod-shaped member 1 is in contact with the outermost electrode (negative electrode 20), the potential difference between the reference electrode (positive electrode 10) and the outermost electrode (negative electrode 20) is detected. Namely, increase in second potential difference (ΔV2) while rod-shaped member 1 remains stopped is considered as indicating occurrence of fusing.

The second potential difference (ΔV2) may not increase up to the initial first potential difference (ΔV1) because the potential difference between positive electrode 10 and negative electrode 20 decreases due to loss of some of the capacity caused by short-circuiting between single layers.

As described previously, suppression of propagation of the short-circuiting current owing to occurrence of fusing is expected. The power storage device where fusing can occur can be evaluated as being resistant to internal short-circuiting.

[6] The method of evaluating a power storage device described in [5] may further include evaluating the power storage device based on a time period elapsed since a time point of stop of the rod-shaped member until a time point of increase in absolute value of the second potential difference.

Likelihood of occurrence of fusing can be evaluated based on a time period elapsed since occurrence of short-circuiting between single layers until fusing. The second potential difference (ΔV2) may change its behavior from decrease to increase before the second potential difference (ΔV2) decreases to 0 V due to a short time period elapsed since occurrence of short-circuiting between single layers until occurrence of fusing.

[7] In the method of evaluating a power storage device described in any one of [4] to [6], the operation to insert the rod-shaped member may be controlled to stop the rod-shaped member when decrease in absolute value of the second potential difference is detected a plurality of times.

According to the method of evaluating a power storage device in the present disclosure, the number of short-circuited layers can be controlled. Therefore, it is considered that the power storage device can also be evaluated at a target number of short-circuited layers which exceeds one.

[8] In the method of evaluating a power storage device described in any one of [1] to [3], the electrode with which the rod-shaped member comes in contact first in the stack portion may be identical to the reference electrode.

As described previously, in this case, short-circuiting between single layers can be detected based on increase in second potential difference ($\Delta V2$).

[9] The method of evaluating a power storage device described in [8] may further include (g) below.

(g) The power storage device is evaluated by detecting decrease in absolute value of the second potential difference while the rod-shaped member remains stopped after the rod-shaped member is stopped.

FIG. 8 is an eighth conceptual diagram for illustrating the method of evaluating a power storage device according to the present disclosure.

When the outermost electrode is identical to the reference electrode and when positive electrode 10 and rod-shaped member 1 are disconnected from each other owing to fusing, the second potential difference ($\Delta V2$) is considered to decrease to substantially 0 V. It is considered that, since rod-shaped member 1 is in contact with the outermost electrode (negative electrode 20), the potential difference between the reference electrode (negative electrode 20) and the outermost electrode (negative electrode 20) is detected.

[10] The method of evaluating a power storage device described in [9] may further include evaluating the power storage device based on a time period elapsed since a time point of stop of the rod-shaped member until a time point of decrease in absolute value of the second potential difference.

When the outermost electrode is identical to the reference electrode as well, likelihood of occurrence of fusing can be evaluated based on a time period elapsed since occurrence of short-circuiting between single layers until fusing. The second potential difference ($\Delta V2$) may change its behavior from increase to decrease before the second potential difference ($\Delta V2$) increases up to the first potential difference ($\Delta V1$) due to a short time period elapsed since occurrence of short-circuiting between single layers until occurrence of fusing.

[11] In the method of evaluating a power storage device described in any one of [8] to [10], the operation to insert the rod-shaped member may be controlled to stop the rod-shaped member when increase in absolute value of the second potential difference is detected a plurality of times.

The number of short-circuited layers can be controlled also when the outermost electrode is identical to the reference electrode. Therefore, it is considered that the power storage device can also be evaluated at a target number of short-circuited layers which exceeds one.

[12] A method of manufacturing a power storage device according to the present disclosure includes at least (A) and (B) below.

(A) A plurality of power storage devices are manufactured.

(B) One or more of the plurality of power storage devices are evaluated with the method of evaluating a power storage device described in any one of [1] to [11].

The method of evaluating a power storage device according to the present disclosure may be used, for example, for a sampling inspection during manufacturing. The method of evaluating a power storage device according to the present disclosure may be used, for example, for reviewing specifications during development. According to the method of manufacturing a power storage device in the present disclosure, manufacturing of power storage devices which can exhibit prescribed capability on the occurrence of internal short-circuiting is expected.

[13] A test system according to the present disclosure is a test system for evaluating a power storage device. The power storage device includes at least a casing and an electrode assembly. The electrode assembly is accommodated in the casing. The electrode assembly includes a positive electrode and a negative electrode. At least one positive electrode and at least one negative electrode are alternately stacked to form a stack portion in the electrode assembly.

The test system includes at least a drive device, a voltage measurement device, and a control device.

The drive device is configured to perform an operation to insert a conductive rod-shaped member into the stack portion along a direction of stack of the positive electrode and the negative electrode.

The voltage measurement device is configured to measure a potential difference between a reference electrode and the rod-shaped member. The positive electrode or the negative electrode is selected as the reference electrode.

The control device is configured to carry out at least one of first control and second control.

In the first control, when an electrode with which the rod-shaped member comes in contact first in the stack portion is different from the reference electrode, the operation to insert the rod-shaped member by the drive device is controlled to stop the rod-shaped member when decrease in absolute value of the potential difference is detected at least once.

In the second control, when the electrode with which the rod-shaped member comes in contact first in the stack portion is identical to the reference electrode, the operation to insert the rod-shaped member by the drive device is controlled to stop the rod-shaped member when increase in absolute value of the potential difference is detected at least once.

The method of evaluating a power storage device described in any one of [1] to [11] can be performed in the test system according to the present disclosure.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a first conceptual diagram for illustrating a method of evaluating a power storage device according to the present disclosure.

FIG. 2 is a second conceptual diagram for illustrating the method of evaluating a power storage device according to the present disclosure.

FIG. 3 is a third conceptual diagram for illustrating the method of evaluating a power storage device according to the present disclosure.

FIG. 4 is a fourth conceptual diagram for illustrating the method of evaluating a power storage device according to the present disclosure.

FIG. 5 is a fifth conceptual diagram for illustrating the method of evaluating a power storage device according to the present disclosure.

FIG. 6 is a sixth conceptual diagram for illustrating the method of evaluating a power storage device according to the present disclosure.

FIG. 7 is a seventh conceptual diagram for illustrating the method of evaluating a power storage device according to the present disclosure.

FIG. 8 is an eighth conceptual diagram for illustrating the method of evaluating a power storage device according to the present disclosure.

DESCRIPTION OF THE PREFERRED EMBODIMENTS

An embodiment of the present disclosure (which is also herein denoted as the "present embodiment") will be described below. The description below, however, does not limit the scope of claims.

<Method of Evaluating Power Storage Device>

Figure 9:
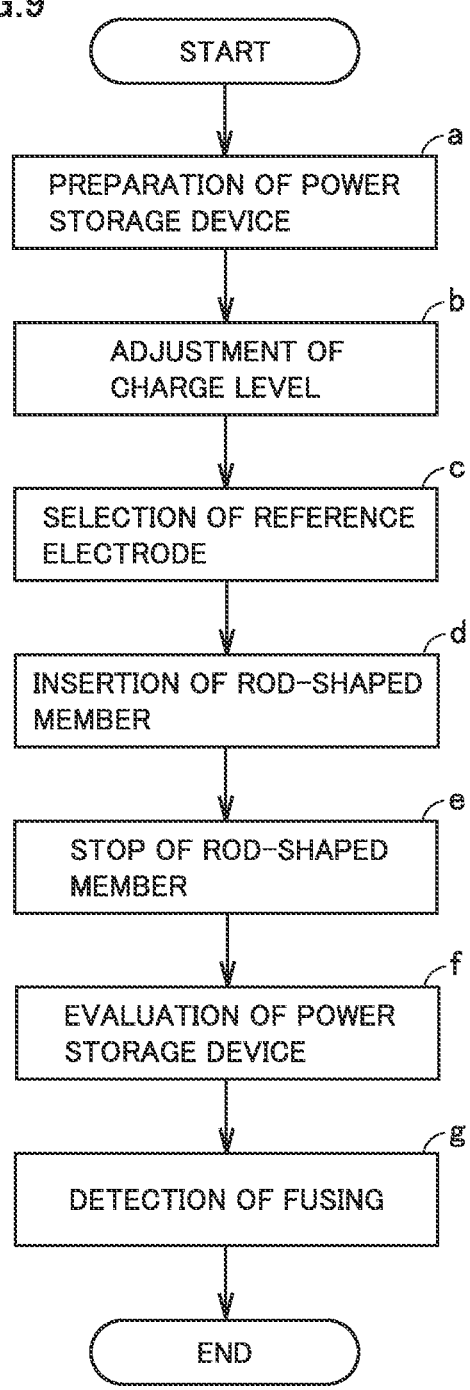
FIG. 9 is a flowchart showing overview of the method of evaluating a power storage device according to the present embodiment.

FIG. 9 is a flowchart showing overview of a method of evaluating a power storage device according to the present embodiment.

The method of evaluating a power storage device in the present embodiment includes at least "(a) preparation of power storage device," "(b) adjustment of charge level," "(c) selection of reference electrode," "(d) insertion of rod-shaped member," "(e) stop of rod-shaped member," and "(f) evaluation of power storage device." The method of evaluating a power storage device in the present embodiment may further include "(g) detection of fusing."

<<(a) Preparation of Power Storage Device>>

The method of evaluating a power storage device in the present embodiment includes preparing a power storage device. In the present embodiment, a single power storage device may be prepared. A plurality of power storage devices may be prepared.

The power storage device should not particularly be limited. The power storage device may be a secondary battery (a rechargeable battery). The power storage device may be a primary battery. The power storage device may be a capacitor. The power storage device may be, for example, a lead acid battery, a nickel-cadmium battery, a nickel metal hydride battery, a lithium ion battery, a sodium ion battery, a lithium primary battery, an electric double layer capacitor, or a lithium ion capacitor.

A shape and a type of a casing (an exterior) should not particularly be limited either. The power storage device may be, for example, a prismatic battery, a cylindrical battery, or a laminate-type battery. The "prismatic" shape represents a parallelepiped shape. The "laminate type" may also be referred to as a pouch type. Overview of the prismatic battery, the cylindrical battery, and the laminate-type battery will be described here.

(Prismatic Battery)

Figure 10:
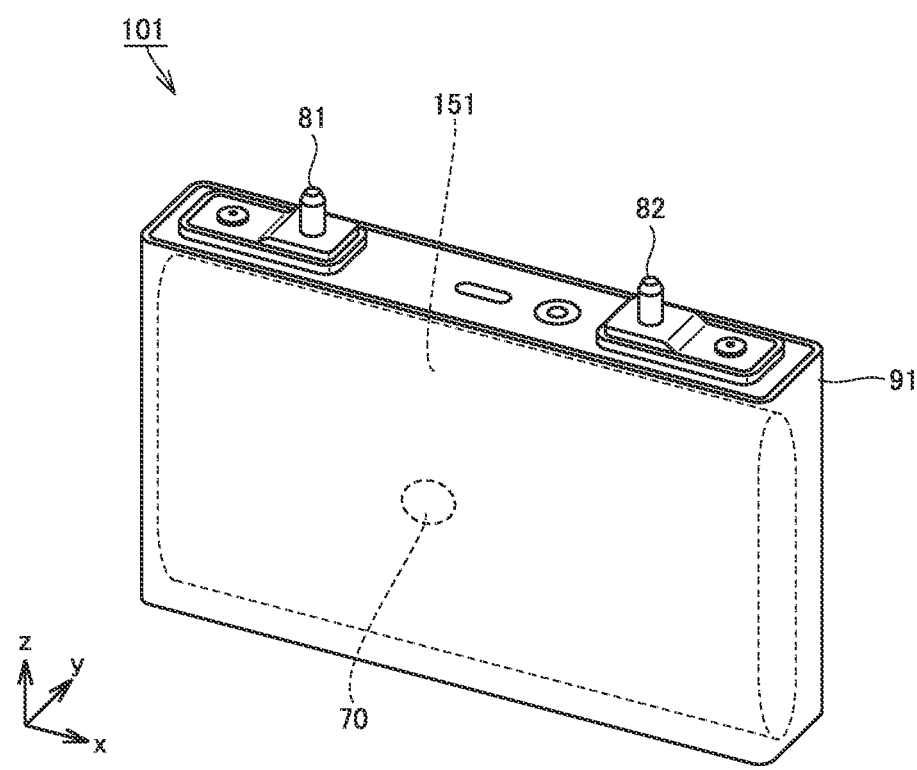
FIG. 10 is a schematic diagram showing one example of a construction of a prismatic battery.

FIG. 10 is a schematic diagram showing one example of a construction of a prismatic battery.

A first power storage device 101 is a prismatic battery. First power storage device 101 includes at least a first casing 91 and a first electrode assembly 151. An outer profile of first casing 91 is in a parallelepiped shape. First casing 91 is formed, for example, of aluminum (Al), an aluminum alloy, stainless steel (SUS), iron (Fe), or a resin. First casing 91 includes a positive electrode terminal 81 and a negative electrode terminal 82. First casing 91 may include, for example, a liquid introduction port, a gas exhaust valve, and a current interrupt device (CID).

First electrode assembly 151 is accommodated in first casing 91. The electrode assembly may also be referred to as an "electrode group" or an "electrode body." An electrolyte is also accommodated in first casing 91. First electrode assembly 151 may be of a wound type. First electrode assembly 151 may be of a stack (layered) type.

Figure 11:
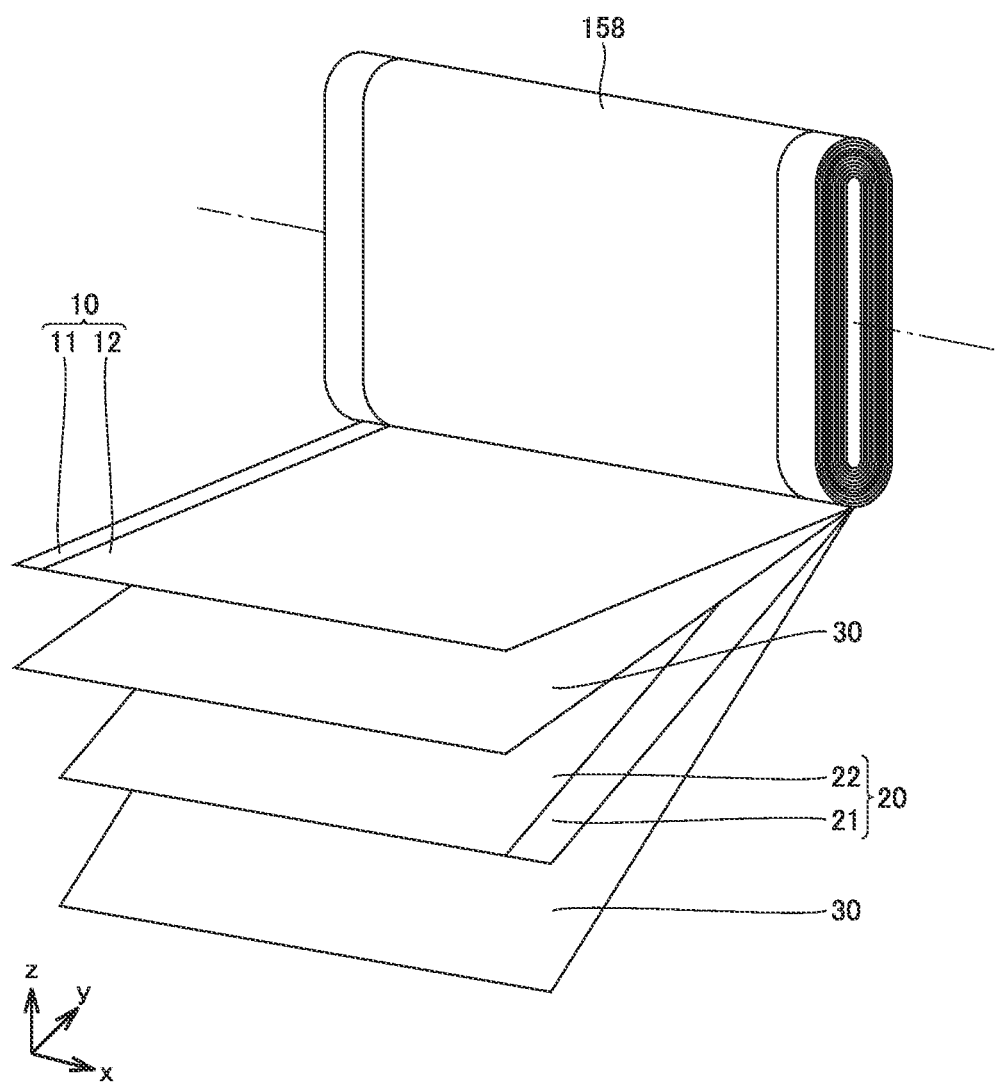
FIG. 11 is a schematic diagram showing an electrode assembly of a wound type.

FIG. 11 is a schematic diagram showing an electrode assembly of a wound type.

First electrode assembly 151 may be a wound electrode assembly 158. Wound electrode assembly 158 includes positive electrode 10, negative electrode 20, and separator 30. Wound electrode assembly 158 is formed by stacking positive electrode 10, separator 30, negative electrode 20, and separator 30 in this order and spirally winding the same. Stack portion 50 is formed in wound electrode assembly 158 by alternately stacking at least one positive electrode 10 and at least one negative electrode 20 (see, for example, FIG. 1).

Wound electrode assembly 158 may be wound to have a flat profile. Wound electrode assembly 158 may be wound cylindrically and thereafter formed to have a flat profile.

Wound electrode assembly 158 may be wrapped, for example, with a wrapping material made of a resin.

Figure 12:
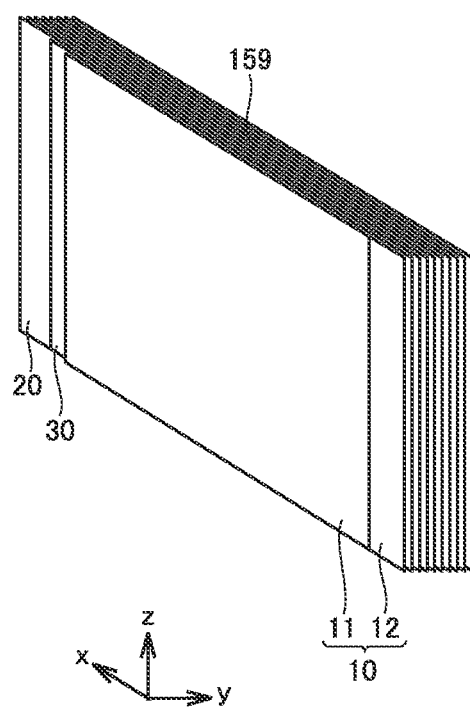
FIG. 12 is a schematic diagram showing an electrode assembly of a stack type.

FIG. 12 is a schematic diagram showing an electrode assembly of a stack type.

First electrode assembly 151 may be a stacked electrode assembly 159. Stacked electrode assembly 159 is formed by alternately stacking positive electrode 10 and negative electrode 20. Stack portion 50 is formed also in stacked electrode assembly 159 by alternately stacking at least one positive electrode 10 and at least one negative electrode 20. Separator 30 is arranged between positive electrode 10 and negative electrode 20.

Positive electrode 10 is electrically connected to positive electrode terminal 81 (see FIGS. 10 and 11). Positive electrode 10 is in a form of a sheet. Positive electrode 10 may include, for example, a positive electrode current collector 11 and a positive electrode active material portion 12 (see FIG. 11). Positive electrode active material portion 12 is formed, for example, by applying a positive electrode composite material containing a positive electrode active material to a surface of positive electrode current collector 11. Positive electrode active material portion 12 may be formed on both of front and rear surfaces of positive electrode current collector 11. The positive electrode composite material may further contain a conductive material and a binder in addition to the positive electrode active material.

In a lithium ion battery, positive electrode current collector 11 may be, for example, an aluminum foil. The positive electrode active material may be, for example, a lithium-containing transition metal oxide. The conductive material may be, for example, carbon black. The binder may be, for example, polyvinylidene difluoride (PVdF).

Negative electrode 20 is electrically connected to negative electrode terminal 82 (see FIGS. 10 and 11). Negative electrode 20 is in a form of a sheet. Negative electrode 20 may include, for example, a negative electrode current collector 21 and a negative electrode active material portion 22 (see FIG. 11). Negative electrode active material portion 22 may be formed on a surface of negative electrode current collector 21. Negative electrode active material portion 22 is formed, for example, by applying a negative electrode composite material containing a negative electrode active material to a surface of negative electrode current collector 21. Negative electrode active material portion 22 may be formed on both of front and rear surfaces of negative electrode current collector 21. The negative electrode composite material may further contain a binder in addition to the negative electrode active material.

In a lithium ion battery, negative electrode current collector 21 may be, for example, a copper (Cu) foil. The negative electrode active material may be, for example, graphite. The binder may be, for example, carboxymethyl cellulose (CMC) and styrene-butadiene rubber (SBR).

Separator 30 may be, for example, a porous film made of a resin (see FIG. 11). Separator 30 may have a multi-layered structure. For example, separator 30 may be formed by stacking a porous film composed of polypropylene (PP), a porous film composed of polyethylene (PE), and a porous film composed of polypropylene in this order.

The electrolyte may be a liquid electrolyte. The liquid electrolyte may be an electrolyte solution. The liquid electrolyte may be an ionic liquid. The electrolyte may be a gel electrolyte (a polymer electrolyte). The electrolyte may be a solid electrolyte. Namely, first power storage device 101 may be an all-solid-state battery. The all-solid-state battery may not require separator 30.

It may be difficult to conduct a forced internal short circuit test for the all-solid-state battery, because once first electrode assembly 151 is disassembled in order to insert a small nickel piece, it is difficult to return arrangement of electrodes to the original state. Since the method of evaluating a power storage device in the present embodiment does not require disassembly of first electrode assembly 151, it is considered that the all-solid-state battery can also be evaluated therewith.

(Cylindrical Battery)

Figure 13:
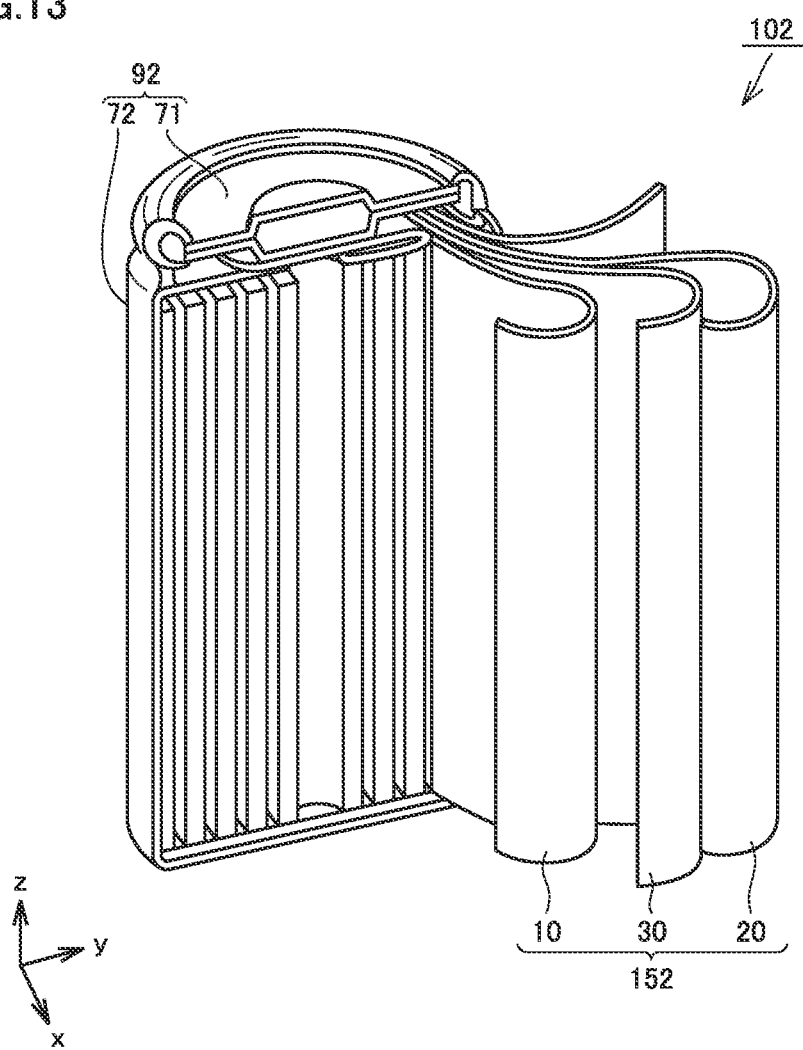
FIG. 13 is a schematic diagram showing one example of a construction of a cylindrical battery.

FIG. 13 is a schematic diagram showing one example of a construction of a cylindrical battery.

A second power storage device 102 is a cylindrical battery. Second power storage device 102 includes a second casing 92 and a second electrode assembly 152. An outer profile of second casing 92 is cylindrical. Second casing 92 is formed, for example, of stainless steel, iron, or a resin. Second casing 92 includes a cap 71 and a can 72. Cap 71 is electrically connected to positive electrode 10 or negative electrode 20. Namely, cap 71 may function as a terminal of positive electrode 10 or negative electrode 20. Can 72 may electrically be connected to positive electrode 10 or negative electrode 20. Namely, can 72 may function as a terminal of positive electrode 10 or negative electrode 20.

Second electrode assembly 152 is accommodated in second casing 92. The electrolyte is also accommodated in second casing 92. Second electrode assembly 152 is of the wound type. Second electrode assembly 152 includes positive electrode 10, negative electrode 20, and separator 30. Second electrode assembly 152 is formed by stacking positive electrode 10, separator 30, negative electrode 20, and separator 30 in this order and spirally winding the same. Stack portion 50 is formed also in second electrode assembly 152 by alternately stacking at least one positive electrode 10 and at least one negative electrode 20.

(Laminate-Type Battery)

Figure 14:
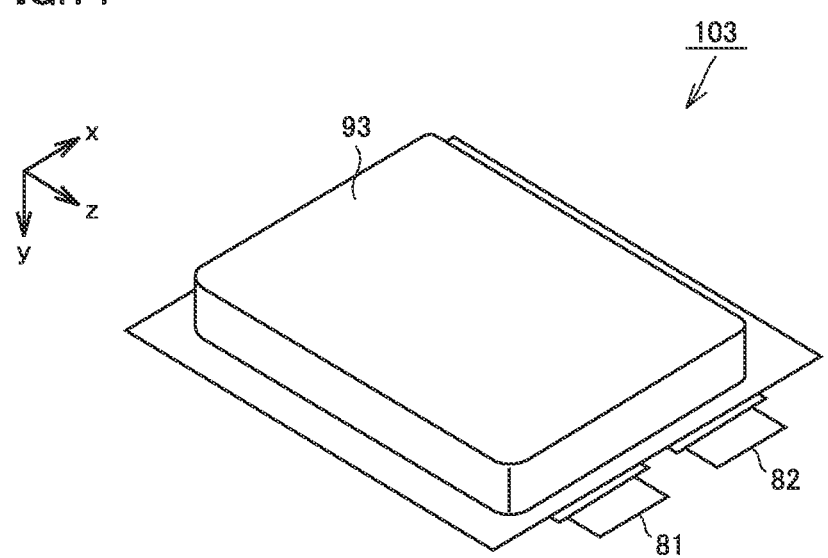
FIG. 14 is a first schematic diagram showing one example of a construction of a laminate-type battery.
Figure 15:
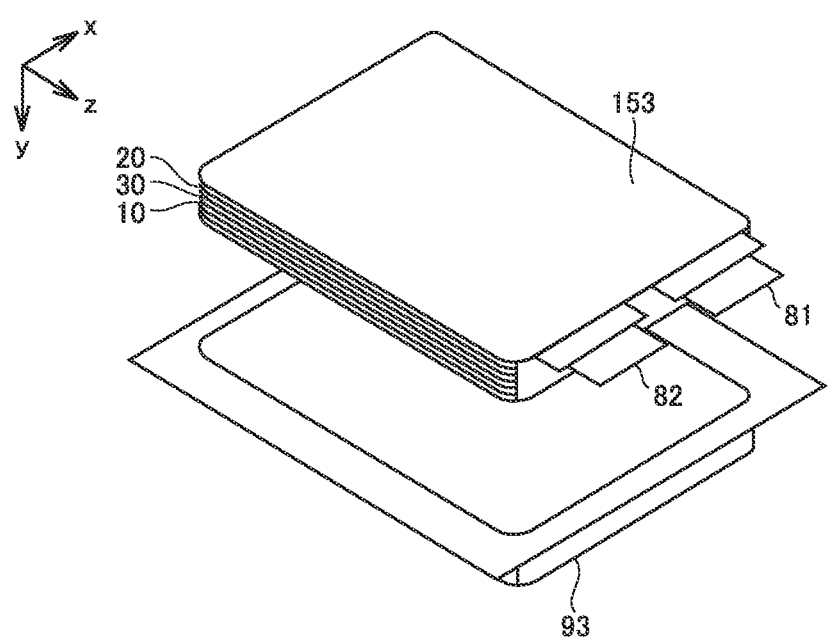
FIG. 15 is a second schematic diagram showing one example of a construction of a laminate-type battery.

FIG. 14 is a first schematic diagram showing one example of a construction of a laminate-type battery. FIG. 15 is a second schematic diagram showing one example of a construction of a laminate-type battery.

A third power storage device 103 is a laminate-type battery. Third power storage device 103 includes at least a third casing 93 and a third electrode assembly 153 (see FIGS. 14 and 15). An outer profile of third casing 93 has a flat shape. Third casing 93 is made of an aluminum laminate enclosure material. The aluminum laminate enclosure material is formed by stacking a resin film, an aluminum foil, and a resin film in this order. Positive electrode terminal 81 (a positive electrode tab) and negative electrode terminal 82 (a negative electrode tab) allow communication between the inside and the outside of third casing 93.

Third electrode assembly 153 is accommodated in third casing 93. The electrolyte is also accommodated in third casing 93. Third electrode assembly 153 is of the stack type. Third electrode assembly 153 is formed by alternately stacking positive electrode 10 and negative electrode 20. Namely, stack portion 50 is formed also in third electrode assembly 153 by alternately stacking at least one positive electrode 10 and at least one negative electrode 20. Separator 30 is arranged between positive electrode 10 and negative electrode 20. Third electrode assembly 153 may be of the wound type.

First power storage device 101 (prismatic battery), second power storage device 102 (cylindrical battery), and third power storage device 103 (laminate-type battery) each include at least the casing and the electrode assembly as set forth above. The electrode assembly is accommodated in the casing. The electrode assembly includes the positive electrode and the negative electrode. The stack portion is formed in the electrode assembly by alternately stacking at least one positive electrode and at least one negative electrode. So long as these features are included, a power storage device different in shape and type from the prismatic battery, the cylindrical battery, and the laminate-type battery may be prepared.

An application mainly to the prismatic battery (first power storage device 101) will be described below for the sake of convenience. The method of evaluating a power storage device in the present embodiment can naturally be applied also to the cylindrical battery and the laminate-type battery.

<<(b) Adjustment of Charge Level>>

The method of evaluating a power storage device in the present embodiment includes adjusting a charge level of first power storage device 101 to produce a first potential difference ($\Delta V1$) between positive electrode 10 and negative electrode 20.

The "charge level" refers to a ratio calculated by excluding a ratio of an amount of electricity discharged from a fully charged state of first power storage device 101. For the primary battery, an unused state is regarded as 100% charge level for the sake of convenience. The charge level is also referred to as a "charging rate" or a "state of charge (SOC)."

The charge level can be adjusted by a general charging and discharging apparatus. The charge level may be adjusted by charging alone. The charge level may be adjusted by discharging alone. The charge level may be adjusted by combination of charging and discharging.

The charge level may be adjusted, for example, to 100%. A condition for short-circuiting may be adjusted based on the charge level. For example, the condition is considered as being severer as the charge level is higher. The charge level may be adjusted, for example, to a level exceeding 100%. The charge level may be adjusted, for example, to a charge level exceeding 0% and lower than 100%. The charge level may be adjusted, for example, to a level not lower than 80% and not higher than 120%.

The charge level can be adjusted in a prescribed temperature environment. The charge level may be adjusted in a temperature environment, for example, not lower than 10° C. and not higher than 40° C. The charge level may be adjusted in a temperature environment, for example, not lower than 40° C. and not higher than 60° C. A prescribed leaving time may be set between adjustment of the charge level and insertion of rod-shaped member 1. The leaving time may be set, for example, to a time period not shorter than thirty minutes and not longer than five hours. The leaving time may be set, for example, to a time period not shorter than one hour and not longer than three hours.

<<(c) Selection of Reference Electrode>>

The method of evaluating a power storage device in the present embodiment includes selecting positive electrode 10 or negative electrode 20 as the reference electrode. Positive electrode 10 may be selected as the reference electrode. It is expected that an amount of variation (an amount of decrease or an amount of increase) in second potential difference ($\Delta V2$) increases when positive electrode 10 is selected as the reference electrode. Negative electrode 20 may be selected as the reference electrode.

<<(d) Insertion of Rod-Shaped Member>>

The method of evaluating a power storage device in the present embodiment includes performing an operation to insert rod-shaped member 1 into stack portion 50 along a direction of stack of positive electrode 10 and negative electrode 20 while the second potential difference ($\Delta V2$) between the reference electrode and conductive rod-shaped member 1 is measured after adjustment of the charge level.

In the present embodiment, rod-shaped member 1 may be inserted into first electrode assembly 151 taken out of first casing 91. In the present embodiment, it is not necessary to disassemble first electrode assembly 151 and it is not necessary either to insert a small nickel piece into first electrode assembly 151. Therefore, an operation is considered as being easier than in the forced internal short circuit test.

In the present embodiment, rod-shaped member 1 may be inserted into first electrode assembly 151 from the outside of first casing 91 without taking out first electrode assembly 151. Namely, rod-shaped member 1 may be inserted into stack portion 50 from the outside of first casing 91. Efficiency in operation is considered as being significantly improved owing to evaluation without disassembly of first power storage device 101.

In the present embodiment, rod-shaped member 1 may be inserted after a temperature of first power storage device 101 or first electrode assembly 151 is kept within a prescribed temperature range. A temperature of first power storage device 101 or first electrode assembly 151 may be kept within a temperature range, for example, not lower than 10° C. and not higher than 50° ° C. For example, "being kept at 40° C." means that first power storage device 101 is left in a thermostatic chamber set at 40° ° C. for a period not shorter than thirty minutes and not longer than one hour.

(Measurement of Second Potential Difference)

Figure 16:
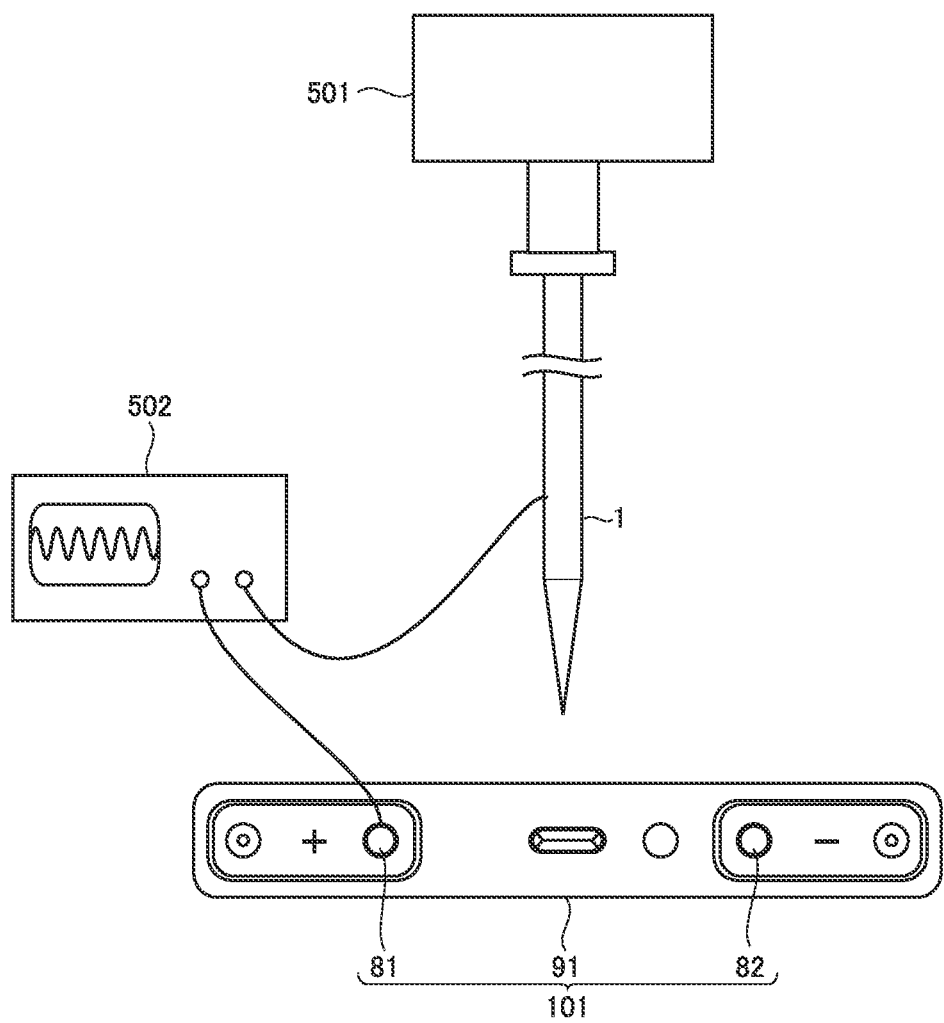
FIG. 16 is a schematic diagram showing one example of a method of measuring a second potential difference.

FIG. 16 is a schematic diagram showing one example of a method of measuring a second potential difference.

The second potential difference ($\Delta V2$) is a potential difference produced between the reference electrode and rod-shaped member 1. The second potential difference ($\Delta V2$) can be measured with a general voltage measurement device 502. Voltage measurement device 502 may have a function, for example, to record transition of a voltage. Namely, voltage measurement device 502 may be a data logger. Voltage measurement device 502 may further perform a temperature measurement function, a current measurement function, and a function to show transition of a voltage.

When rod-shaped member 1 is inserted from the outside of first casing 91 without disassembly of first power storage device 101, an electrode terminal selected as the reference electrode and the rod-shaped member are connected to respective measurement terminals of voltage measurement device 502. For example, when positive electrode 10 is selected as the reference electrode, positive electrode terminal 81 is connected to voltage measurement device 502. A prescribed lead can be used for connection. FIG. 16 shows an example in which positive electrode 10 is selected as the reference electrode. When negative electrode 20 is selected as the reference electrode, negative electrode terminal 82 is connected to voltage measurement device 502.

When first electrode assembly 151 is taken out of first casing 91 and evaluation is made, for example, a collector member provided in first electrode assembly 151 (a collector lead, a collector tab, or a collector plate) instead of the electrode terminal (positive electrode terminal 81 or negative electrode terminal 82) is connected to the measurement terminal. A member electrically connected to entire positive electrode 10 or entire negative electrode 20 is set as the collector member.

(Control of Insertion Operation)

An operation to insert rod-shaped member 1 is performed by a drive device 501. Drive device 501 may be, for example, a nail penetration test apparatus or a crash test apparatus. Drive device 501 includes, for example, a servo motor. Drive device 501 includes a rod-shaped member 1 attachment portion. Drive device 501 moves the rod-shaped member 1 attachment portion in one prescribed direction (for example, a vertical direction).

(Rod-Shaped Member)

Figure 17:
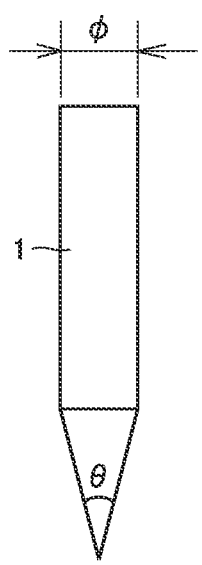
FIG. 17 is a conceptual cross-sectional view showing one example of a construction of a rod-shaped member.

FIG. 17 is a conceptual cross-sectional view showing one example of a construction of the rod-shaped member.

Rod-shaped member 1 has at least a length exceeding a total thickness of positive electrode 10, negative electrode 20, and separator 30. A length of rod-shaped member 1 can be selected as appropriate in accordance with a target number of short-circuited layers. Rod-shaped member 1 may have a length, for example, not shorter than 10 mm and not longer than 200 mm. Rod-shaped member 1 may have a length, for example, not shorter than 10 mm and not longer than 150 mm. Rod-shaped member 1 may have a length, for example, not shorter than 10 mm and not longer than 50 mm. The "length" represents a total length in an axial direction.

Rod-shaped member 1 is conductive. "Being conductive" means being formed of a material of a resistivity not higher than $10^{-3}$ Ω·m within a temperature range not lower than 0° C. and not higher than 25° C. A value in a literature such as "Kagaku Binran (Edited by The Chemical Society of Japan and published by Maruzen Publishing, Co., Ltd.)" may be used as a resistivity of a material.

Rod-shaped member 1 may be made, for example, of a metal. Rod-shaped member 1 may be made, for example, of iron. It is expected that rod-shaped member 1 is manufactured more inexpensively than an evaluation jig (a composite member of an insulating rod and a conductive member) in Japanese Patent Laying-Open No. 2010-250954. For example, a commercially available nail may be employed as rod-shaped member 1. Rod-shaped member 1 may partially contain an insulating material so long as the second potential difference (ΔV2) can be measured.

Rod-shaped member 1 may be solid. Rod-shaped member 1 may be hollow. Rod-shaped member 1 may be, for example, cylindrical. A shape in a cross-section orthogonal to the axial direction of rod-shaped member 1 should not particularly be limited. The cross-sectional shape may be, for example, circular, square, or hexagonal. When the cross-sectional shape of rod-shaped member 1 is not circular, a maximum width in the cross-section orthogonal to the axial direction of rod-shaped member 1 is regarded as a diameter (φ).

The diameter (φ) of rod-shaped member 1 can be selected as appropriate, for example, depending on a material or a thickness of first casing 91 and first electrode assembly 151. For example, when first casing 91 is made of a metal, in order for rod-shaped member 1 to pass through first casing 91, a thickness thereof to some extent may be necessary. For example, when a casing is formed of a soft material such as an aluminum laminate enclosure material, rod-shaped member 1 can pass through the casing even though rod-shaped member 1 is thin.

Rod-shaped member 1 may have a diameter (φ), for example, not smaller than 1 mm and not greater than 20 mm. Rod-shaped member 1 may have a diameter (φ), for example, not smaller than 1 mm and not greater than 10 mm. Rod-shaped member 1 may have a diameter (φ), for example, not smaller than 1 mm and not greater than 5 mm. Rod-shaped member 1 may have a diameter (φ), for example, not smaller than 1 mm and not greater than 3 mm. Rod-shaped member 1 may have a diameter (φ), for example, not smaller than 3 mm and not greater than 5 mm.

Rod-shaped member 1 may include a pointed tip end. With rod-shaped member 1 including a pointed tip end, rod-shaped member 1 is expected to more easily pass through first casing 91, positive electrode 10, and negative electrode 20. An excessively sharp tip end, however, may collapse, for example, when it comes in contact with first casing 91 made of a metal, and rod-shaped member 1 may not be able to pass through first casing 91. For example, when the casing is formed of a soft material such as an aluminum laminate enclosure material, rod-shaped member 1 may be able to pass through the casing even though rod-shaped member 1 includes a sharp tip end.

An angle at the tip end (θ) may be, for example, not smaller than ten degrees and not greater than ninety degrees. An angle at the tip end (θ) may be, for example, not smaller than twenty degrees and not greater than ninety degrees.

Rod-shaped member 1 may be tapered as a whole. Only a tip end portion of rod-shaped member 1 may be tapered. When only the tip end portion is tapered, the tip end portion may have a length, for example, not shorter than 0.5 mm and not longer than 100 mm. The tip end portion may have a length, for example, not shorter than 0.5 mm and not longer than 60 mm.

(Direction of Insertion)

Rod-shaped member 1 is inserted into stack portion 50 along the direction of stack of positive electrode 10 and negative electrode 20. The direction of insertion of rod-shaped member 1 is desirably substantially identical to the direction of stack of positive electrode 10 and negative electrode 20. When rod-shaped member 1 is inserted into stack portion 50, an angle formed between the direction of stack of positive electrode 10 and negative electrode 20 and the axial direction of rod-shaped member 1 may be, for example, not smaller than zero degree and not greater than thirty degrees.

When first electrode assembly 151 is wound electrode assembly 158 (see FIGS. 10 and 11), a direction orthogonal to a surface greatest in area of outer surfaces of first power storage device 101 (the direction of the y axis in FIGS. 10 and 11) is desirably selected as the direction of insertion. A direction of a z axis in FIG. 10 may be selected as the direction of insertion. When first electrode assembly 151 is stacked electrode assembly 159 (see FIGS. 10 and 12), the direction of the y axis in FIGS. 10 and 12 is regarded as the direction of stack.

(Position of Insertion)

A position of insertion of rod-shaped member 1 is set, for example, around the center of first electrode assembly 151 (see FIG. 10). The center represents the geometric center in a plane orthogonal to the direction of stack of positive electrode 10 and negative electrode 20 (for example, an xz plane in FIG. 10). For example, rod-shaped member 1 may be inserted in a circular region 70 having a prescribed radius of which geometric center is defined as a central point. The radius of circular region 70 may be varied as appropriate depending on a size of first electrode assembly 151.

(Rate of Insertion)

A rate of insertion may be set, for example, such that a distance of travel of rod-shaped member 1 from detection of variation (decrease or increase) in second potential difference (ΔV2) until stop of rod-shaped member 1 is smaller than a thickness of positive electrode 10 or negative electrode 20. Improvement, for example, in accuracy in control of the number of short-circuited layers is thus expected.

The rate of insertion may be, for example, not higher than 10 mm/second. The rate of insertion may be, for example, not higher than 1 mm/second. The rate of insertion may be, for example, not higher than 0.1 mm/second. The rate of insertion may be, for example, not higher than 0.01 mm/second. The rate of insertion may be, for example, not lower than 0.001 mm/second. The rate of insertion may be, for example, not lower than 0.001 mm/second and not higher than 0.1 mm/second.

<<(e) Stop of Rod-Shaped Member>>

The method of evaluating a power storage device in the present embodiment includes stopping rod-shaped member 1.

When an electrode with which rod-shaped member 1 comes in contact first in stack portion 50 (outermost electrode) is different from the reference electrode, the insertion operation is controlled to stop rod-shaped member 1 when decrease in absolute value of the second potential difference ($\Delta V2$) is detected at least once (see FIG. 3). When the outermost electrode is identical to the reference electrode, the insertion operation is controlled to stop rod-shaped member 1 when increase in absolute value of the second potential difference ($\Delta V2$) is detected at least once (see FIG. 6).

An interval of measurement of the second potential difference ($\Delta V2$) may be set, for example, to at least 100 points/second. For example, an operator may check transition of the second potential difference ($\Delta V2$) on a display (a monitor) of voltage measurement device 502. The operator may detect variation (decrease or increase) beyond a threshold value of the second potential difference ($\Delta V2$) and operate the drive device (a nail penetration test apparatus) for stopping rod-shaped member 1.

Figure 18:
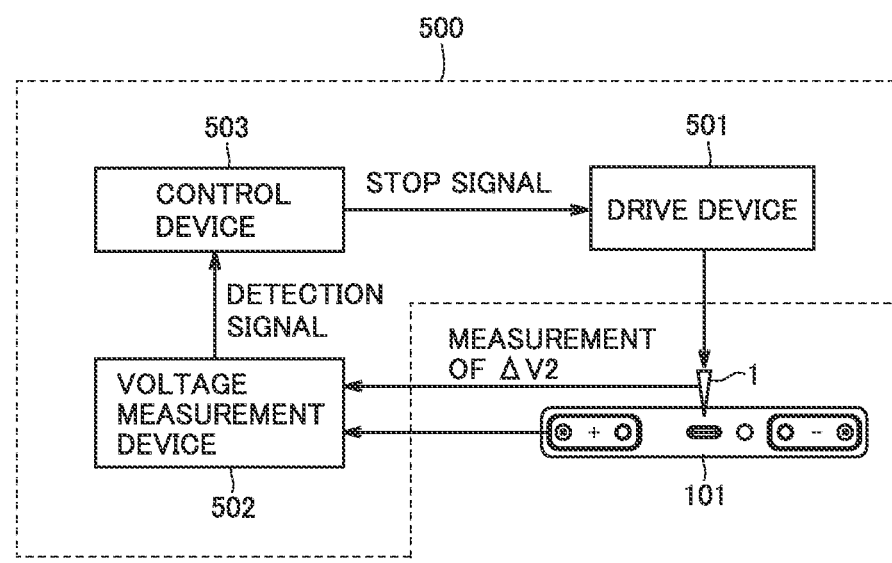
FIG. 18 is a block diagram showing one example of a test system according to the present embodiment.

FIG. 18 is a block diagram showing one example of a test system according to the present embodiment.

Details of a test system 500 will be described later. Control of the insertion operation will be described here.

For example, voltage measurement device 502 may detect variation (decrease or increase) beyond the threshold value of the second potential difference ($\Delta V2$). Voltage measurement device 502 may transmit a detection signal to a control device 503 simultaneously with detection of variation beyond the threshold value. Control device 503 may transmit a stop signal to drive device 501 to stop rod-shaped member 1 in response to the detection signal. Detection of variation beyond the threshold value and stop of rod-shaped member 1 may substantially be simultaneous. There may be a slight time lag between detection of variation beyond the threshold value and stop of rod-shaped member 1. The time lag may be, for example, not shorter than ten seconds and not longer than fifty seconds. The time lag may be shorter than ten seconds.

The threshold value (trigger for stop) may be set, for example, to 10 mV. When the outermost electrode is different from the reference electrode, the insertion operation may be controlled to stop rod-shaped member 1 at the time point of detection of decrease by 10 mV or more in second potential difference ($\Delta V2$). When the outermost electrode is identical to the reference electrode, the insertion operation may be controlled to stop rod-shaped member 1 at the time point of detection of increase by 10 mV or more in second potential difference ($\Delta V2$). The threshold value may be set to 50 mV. The threshold value may be set to 100 mV. The threshold value may be not lower than 50 mV and not higher than 100 mV.

<<(f) Evaluation of Power Storage Device>>

The method of evaluating a power storage device in the present embodiment includes evaluating first power storage device 101 based on a state of first power storage device 101 after rod-shaped member 1 is stopped.

Short-circuiting between single layers is considered to have occurred at the time point of detection of variation (decrease or increase) beyond the threshold value. A state of first power storage device 101 is checked after rod-shaped member 1 is stopped so as not to increase the number of short-circuited layers.

For example, at least one selected from the group consisting of an appearance of first power storage device 101, a surface temperature of first power storage device 101, and a voltage of first power storage device 101 may be checked. The appearance may visually be checked. The appearance may be recorded, for example, in video images and still images. For example, deformation, discoloration, fracture, liquid leakage, or smoking may occur in the appearance. A temperature is measured with a temperature measurement device. A thermal distribution may be measured with thermography. A voltage (a potential difference between positive electrode 10 and negative electrode 20) is measured with a voltmeter.

A state may be checked for a prescribed period of time. A state of first power storage device 101 may be checked, for example, for a period not shorter than ten seconds and not longer than one hour. A state of first power storage device 101 may be checked, for example, for a period not shorter than one minute and not longer than thirty minutes.

First power storage device 101 is evaluated based on a result of checking of the state. First power storage device 101 may be evaluated based on results of checking of a plurality of first power storage devices 101.

<<(g) Detection of Fusing>>

The method of evaluating a power storage device in the present embodiment may further include detection of fusing. When the outermost electrode is different from the reference electrode, first power storage device 101 may be evaluated based on detection of increase in absolute value of the second potential difference ($\Delta V2$) while rod-shaped member 1 remains stopped after rod-shaped member 1 is stopped. When the outermost electrode is identical to the reference electrode, first power storage device 101 may be evaluated based on detection of decrease in absolute value of the second potential difference ($\Delta V2$) while rod-shaped member 1 remains stopped after rod-shaped member 1 is stopped.

As shown in FIGS. 7 and 8, reversal of the second potential difference ($\Delta V2$) may be detected after rod-shaped member 1 is stopped. "Reversal" means change from decrease to increase (see FIG. 7) or change from increase to decrease (see FIG. 8). Reversal of the second potential difference ($\Delta V2$) is considered to indicate occurrence of fusing. First power storage device 101 in which fusing can occur can be evaluated as being resistant to internal short-circuiting.

Likelihood of occurrence of fusing may be evaluated. Likelihood of occurrence of fusing can be evaluated based on a time period elapsed since the time point of stop of rod-shaped member 1 until the time point of reversal of the second potential difference ($\Delta V2$).

When the outermost electrode is different from the reference electrode, a time period elapsed since the time point of stop of rod-shaped member 1 until the time point of increase in absolute value of the second potential difference ($\Delta V2$) is counted. As the elapsed time period is shorter, first power storage device 101 can be evaluated as being higher in likelihood of fusing.

When the outermost electrode is identical to the reference electrode, a time period elapsed since the time point of stop of rod-shaped member 1 until the time point of decrease in absolute value of the second potential difference ($\Delta V2$) is counted. As the elapsed time period is shorter, first power storage device 101 can be evaluated as being higher in likelihood of fusing.

(Short-Circuiting Through Multiple Layers)

First power storage device 101 may be evaluated based on short-circuiting through multiple layers. When the outermost electrode is different from the reference electrode, the insertion operation may be controlled to stop rod-shaped member 1 when decrease in second potential difference ($\Delta V2$) is detected a plurality of times. When the outermost electrode is identical to the reference electrode, the insertion operation may be controlled to stop rod-shaped member 1 when increase in second potential difference ($\Delta V2$) is detected a plurality of times.

The number of times of detection is determined by a target number of short-circuited layers. For example, when the outermost electrode is different from the reference electrode and the target number of short-circuited layers is set to two, the insertion operation is controlled to stop rod-shaped member 1 at the time point of detection of decrease beyond the threshold value for the second time. After rod-shaped member 1 is stopped, a state of first power storage device 101 is checked.

For example, when the outermost electrode is identical to the reference electrode and the target number of short-circuited layers is set to two, the insertion operation is controlled to stop rod-shaped member 1 at the time point of detection of increase beyond the threshold value for the second time. After rod-shaped member 1 is stopped, a state of first power storage device 101 is checked.

For example, when first power storage device 101 cannot be evaluated as good or defective based on a state on the occurrence of short-circuiting between single layers, first power storage device 101 may be evaluated as good or defective also based on a state on the occurrence of short-circuiting through multiple layers.

<Method of Manufacturing Power Storage Device>

Figure 19:
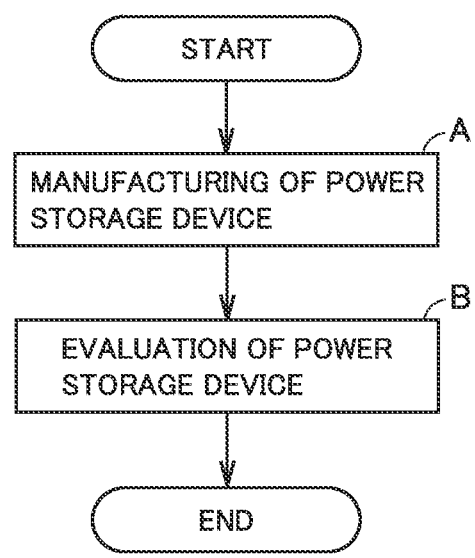
FIG. 19 is a flowchart showing overview of a method of manufacturing a power storage device according to the present embodiment.

FIG. 19 is a flowchart showing overview of a method of manufacturing a power storage device according to the present embodiment.

The method of manufacturing a power storage device in the present embodiment includes at least "(A) manufacturing of power storage device" and "(B) evaluation of power storage device."

<<(A) Manufacturing of Power Storage Device>>

The method of manufacturing a power storage device in the present embodiment includes manufacturing a plurality of first power storage devices 101.

The method of manufacturing first power storage device 101 should not particularly be limited. First power storage device 101 can be manufactured as appropriate in accordance with specifications thereof. A plurality of first power storage devices 101 identical in specifications may be manufactured. A plurality of first power storage devices 101 different in specifications may be manufactured.

<<(B) Evaluation of Power Storage Device>>

The method of manufacturing a power storage device in the present embodiment includes evaluating one or more first power storage devices 101 among a plurality of first power storage devices 101 with the method of evaluating a power storage device in the present embodiment described previously.

The method of evaluating a power storage device in the present embodiment may be used, for example, for a sampling inspection during manufacturing. For example, one or more first power storage devices 101 may be taken out of a certain manufacturing lot. Whether or not the manufacturing lot is good may be determined based on a result of evaluation of one or more first power storage devices 101. According to the method of manufacturing a power storage device in the present embodiment, first power storage device 101 which can exhibit prescribed capability on the occurrence of internal short-circuiting can be manufactured.

The method of evaluating a power storage device in the present embodiment may be used, for example, for reviewing specifications during development. A plurality of first power storage devices 101 according to certain specifications may be manufactured. Whether or not the specifications are to be adopted may be determined based on a result of evaluation of one or more first power storage devices 101. According to the method of manufacturing a power storage device in the present embodiment, first power storage device 101 which can exhibit prescribed capability on the occurrence of internal short-circuiting can be provided.

<Test System>

FIG. 18 is a block diagram showing one example of a test system according to the present embodiment.

Test system 500 is a test system for evaluating first power storage device 101. Details of first power storage device 101 are as described previously.

Test system 500 includes at least drive device 501, voltage measurement device 502, and control device 503. Drive device 501 is configured to perform an operation to insert conductive rod-shaped member 1 into stack portion 50 along the direction of stack of positive electrode 10 and negative electrode 20. Details of stack portion 50 and rod-shaped member 1 are as described previously.

Voltage measurement device 502 is configured to measure a potential difference between the reference electrode and rod-shaped member 1 [second potential difference ($\Delta V2$)]. Positive electrode 10 or negative electrode 20 is selected as the reference electrode.

Control device 503 is configured to carry out at least one of first control and second control. Control device 503 may be configured to carry out one of first control and second control. Control device 503 may be configured to carry out both of first control and second control.

In the first control, when an electrode with which rod-shaped member 1 comes in contact first in stack portion 50 (outermost electrode) is different from the reference electrode, the insertion operation by drive device 501 is controlled to stop rod-shaped member 1 when decrease in absolute value of the potential difference [second potential difference ($\Delta V2$)] is detected at least once.

In the second control, when the outermost electrode is identical to the reference electrode, the insertion operation by drive device 501 is controlled to stop rod-shaped member 1 when increase in absolute value of the potential difference [second potential difference ($\Delta V2$)] is detected at least once.

Control device 503 may be incorporated, for example, in drive device 501 or voltage measurement device 502. In test system 500, the method of evaluating a power storage device in the present embodiment described previously can be performed.

EXAMPLES

Examples of the present disclosure will be described below. The description below does not limit the scope of claims.

<Experiment 1. The Number of Short-Circuited Layers>

In Experiment 1, the number of short-circuited layers was examined in various evaluation methods.

<<Specifications of Power Storage Device>>

A prismatic battery (first power storage device 101) of a rated capacity below was prepared.

Rated capacity: 5 Ah, 25 Ah, 50 Ah, 75 Ah, and 100 Ah

Specifications other than the rated capacity of each first power storage device 101 are as shown below.

Charge upper limit voltage: 4.1 V
Discharge lower limit voltage: 3 V
First casing: made of Al alloy
Electrode assembly: wound electrode assembly (negative electrode 20 being selected as the outermost electrode)
Positive electrode active material: lithium nickel cobalt manganese composite oxide
Negative electrode active material: graphite
Separator: porous film made of resin (three-layered structure)

In first power storage device 101 in Experiment 1, first casing 91 is insulated from positive electrode 10 and negative electrode 20. Namely, first casing 91 has a neutral potential.

Comparative Example 1

Comparative Example 1 represents an evaluation method in conformity with the forced internal short circuit test (JIS C 8714).

The number of power storage devices 101 to be evaluated was set to three for each rated capacity. The charge level of first power storage device 101 was adjusted to 100%. After adjustment of the charge level, a voltage of first power storage device 101 was 4.1 V. Detection of lowering in voltage by 50 mV or more was regarded as occurrence of short-circuiting. After short-circuiting occurred, a state of first power storage device 101 was checked. After the state was checked, wound electrode assembly 158 was disassembled and how many electrodes involved the short-circuiting was checked. Table 1 below shows results.

Comparative Example 2

Comparative Example 2 represents an evaluation method in conformity with Japanese Patent Laying-Open No. 2010-250954.

The number of power storage devices 101 to be evaluated was set to three for each rated capacity. The charge level of first power storage device 101 was adjusted to 100%. After adjustment of the charge level, a voltage of first power storage device 101 was 4.1 V.

An evaluation jig was prepared. A ceramic nail of which tip end portion alone was made of a metal was adopted as the evaluation jig. The evaluation jig was inserted into first power storage device 101. Detection of lowering in voltage by 2 mV or more was regarded as occurrence of short-circuiting, and the operation to insert the evaluation jig was stopped. After the evaluation jig was stopped, a state of first power storage device 101 was checked. After the state was checked, wound electrode assembly 158 was disassembled, and how many electrodes involved the short-circuiting was checked. Table 1 below shows results.

Example 1

Example 1 was implemented with a target number of short-circuited layers being set to one. The charge level of first power storage device 101 was adjusted to 100%. After the charge level was adjusted, the first potential difference ($\Delta V1$) was 4.1 V. A commercially available nail was prepared as rod-shaped member 1. Positive electrode terminal 81 and the nail were connected to respective measurement terminals of voltage measurement device 502 through prescribed leads. Namely, positive electrode 10 was selected as the reference electrode. The outermost electrode (negative electrode 20) is different from the reference electrode.

The nail was inserted into first power storage device 101 along the direction of stack of positive electrode 10 and negative electrode 20 while the second potential difference ($\Delta V2$) between positive electrode 10 (positive electrode terminal 81) and the nail was measured.

Figure 20:
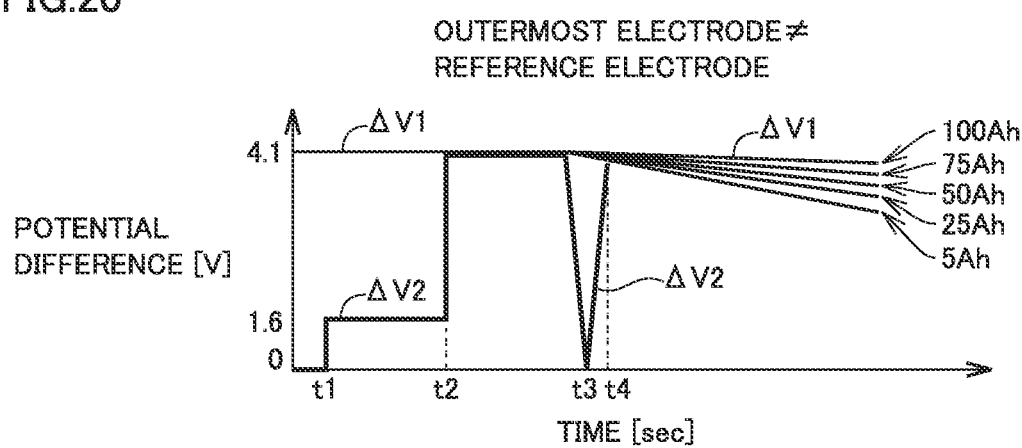
FIG. 20 is a graph showing transition of a potential difference in Example 1.

FIG. 20 is a graph showing transition of a potential difference in Example 1.

At a first time point (t1), the nail came in contact with first casing 91 (Al alloy). The second potential difference ($\Delta V2$) at this time indicated the potential difference (1.6 V) between first casing 91 and positive electrode 10.

At a second time point (t2), the nail came in contact with the outermost electrode (negative electrode 20). The second potential difference ($\Delta V2$) at this time increased to the potential difference between positive electrode 10 and negative electrode 20, that is, the first potential difference ($\Delta V1$).

At a third time point (t3), the nail passed through negative electrode 20 and separator 30 and came in contact with positive electrode 10. The second potential difference ($\Delta V2$) at this time decreased substantially to 0 V. At the third time point (t3), the nail was stopped. After the nail was stopped, a state of first power storage device 101 was checked. Table 1 below shows results.

While the nail remained stopped, increase (reversal) in second potential difference ($\Delta V2$) was detected. At a fourth time point (t4), increase in second potential difference ($\Delta V2$) stopped.

Thereafter, wound electrode assembly 158 was disassembled, and how many electrodes involved the short-circuiting was checked. Table 1 below shows results.

Example 2

Figure 21:
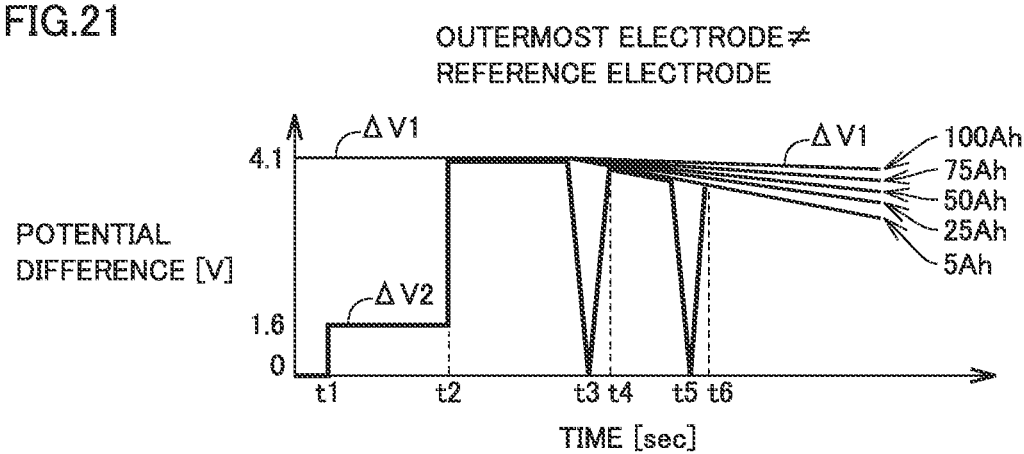
FIG. 21 is a graph showing transition of a potential difference in Example 2.

FIG. 21 is a graph showing transition of a potential difference in Example 2.

Example 2 was implemented with a target number of short-circuited layers being set to two. In Example 2, operations the same as in Example 1 were performed until the fourth time point (t4). Furthermore, in Example 2, an operation to insert the nail was again performed from the fourth time point (t4). At a fifth time point (t5), the nail again came in contact with positive electrode 10, and the second potential difference ($\Delta V2$) decreased substantially to 0 V. At the fifth time point (t5), the nail was stopped. After the nail was stopped, a state of first power storage device 101 was checked. Table 1 below show results.

While the nail remained stopped, increase (reversal) in second potential 10 difference ($\Delta V2$) was detected. At a sixth time point (t6), increase in second potential difference ($\Delta V2$) stopped. Thereafter, wound electrode assembly 158 was disassembled, and how many electrodes involved the short-circuiting was checked. Table 1 below shows results.

TABLE 1

The Number of Short-Circuited Layers

| | Rated Capacity | State After Short-Circuiting | The Number of Short-Circuited Layers | | |
|---|---|---|---|---|---|
| | | | No. 1 | No. 2 | No. 3 |
| Comparative Example 1 (Forced Internal Short Circuit Test) | 5 Ah | Heat Generation | 2 | 1 | 2 |
| | 25 Ah | | 1 | 2 | 2 |
| | 50 Ah | | 1 | 2 | 2 |
| | 75 Ah | | 1 | 2 | 2 |
| | 100 Ah | | 1 | 2 | 2 |
| Comparative Example 2 (Lowering in Voltage by 2 mV as Stop Condition) | 5 Ah | Heat Generation | 3 | 4 | 5 |
| | 25 Ah | | 4 | 5 | 6 |
| | 50 Ah | | 7 | 8 | 6 |
| | 75 Ah | | 10 | 8 | 9 |
| | 100 Ah | High Heat Generation | — | — | 10 |
| Example 1 (Target Number of Short-Circuited Layers: One Layer) | 5 Ah | Heat Generation | 1 | 1 | 1 |
| | 25 Ah | | 1 | 1 | 1 |
| | 50 Ah | | 1 | 1 | 1 |
| | 75 Ah | | 1 | 1 | 1 |
| | 100 Ah | | 1 | 1 | 1 |
| Example 2 (Target Number of Short-Circuited Layers: Two Layers) | 5 Ah | Heat Generation | 2 | 2 | 2 |
| | 25 Ah | | 2 | 2 | 2 |
| | 50 Ah | | 2 | 2 | 2 |
| | 75 Ah | | 2 | 2 | 2 |
| | 100 Ah | | 2 | 2 | 2 |

<<Results in Experiment 1>>

Figure 22:
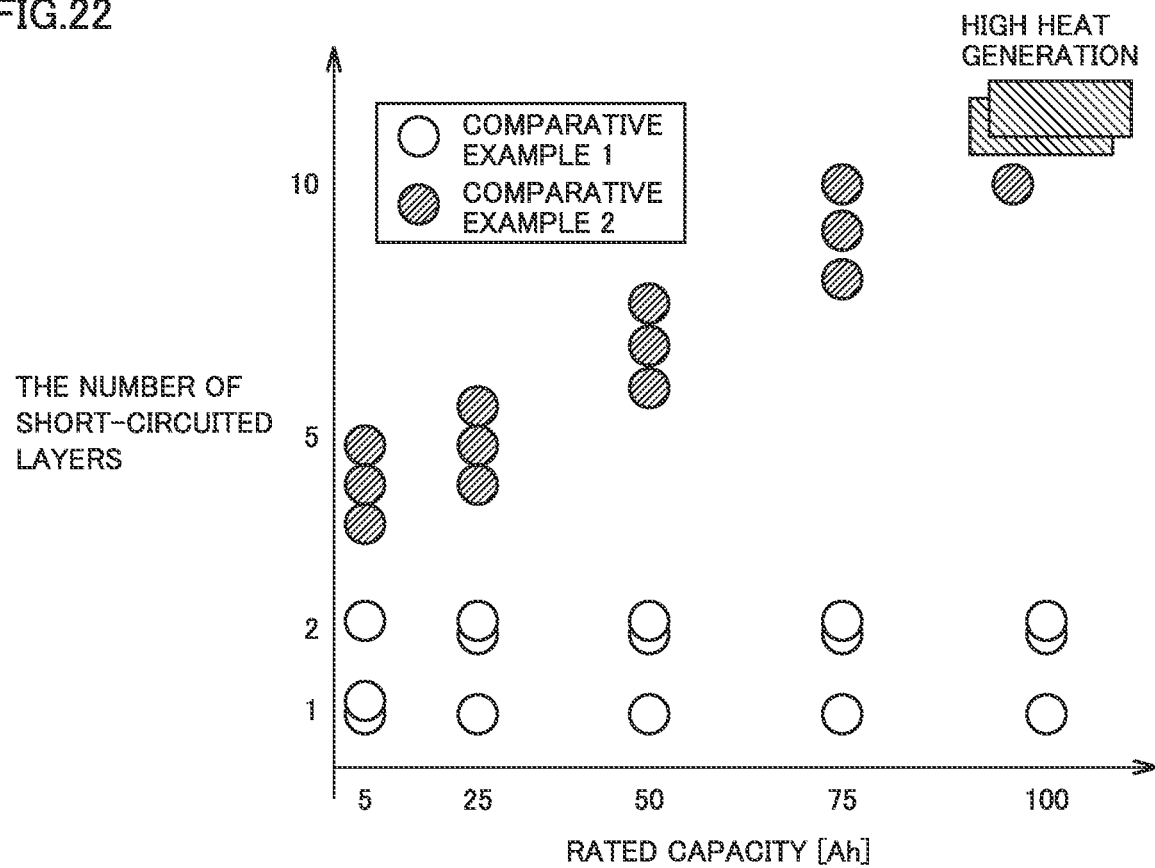
FIG. 22 is a graph showing relation between a rated capacity of a power storage device and the number of short-circuited layers in Comparative Examples 1 and 2.

FIG. 22 is a graph showing relation between a rated capacity of a power storage device and the number of short-circuited layers in Comparative Examples 1 and 2.

In Comparative Example 1 (forced internal short circuit test), the number of short-circuited layers is stable at one to two layers. When the target number of short-circuited layers is set to one, however, control of the number of short-circuited layers is considered also as being insufficient.

In Comparative Example 2, as the rated capacity is higher, the number of short-circuited layers is greater. In Comparative Example 2, some samples of first power storage device 101 of 100 Ah were high in heat generation and the number of short-circuited layers therein could not be confirmed.

Figure 23:
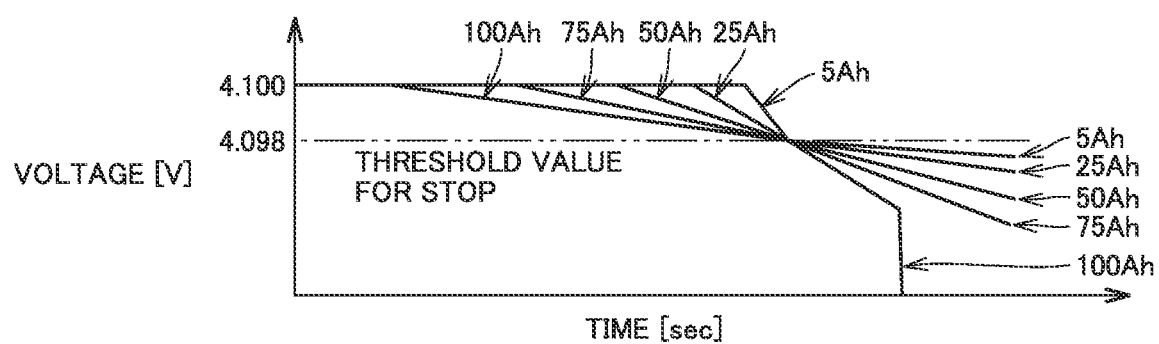
FIG. 23 is a graph showing transition of a voltage in Comparative Example 2.

FIG. 23 is a graph showing transition of a voltage in Comparative Example 2.

In Comparative Example 2, as the rated capacity of first power storage device 101 is higher, a voltage after the ceramic nail was stopped is lower. Increase in number of short-circuited layers described previously accounts for this result.

Figure 24:
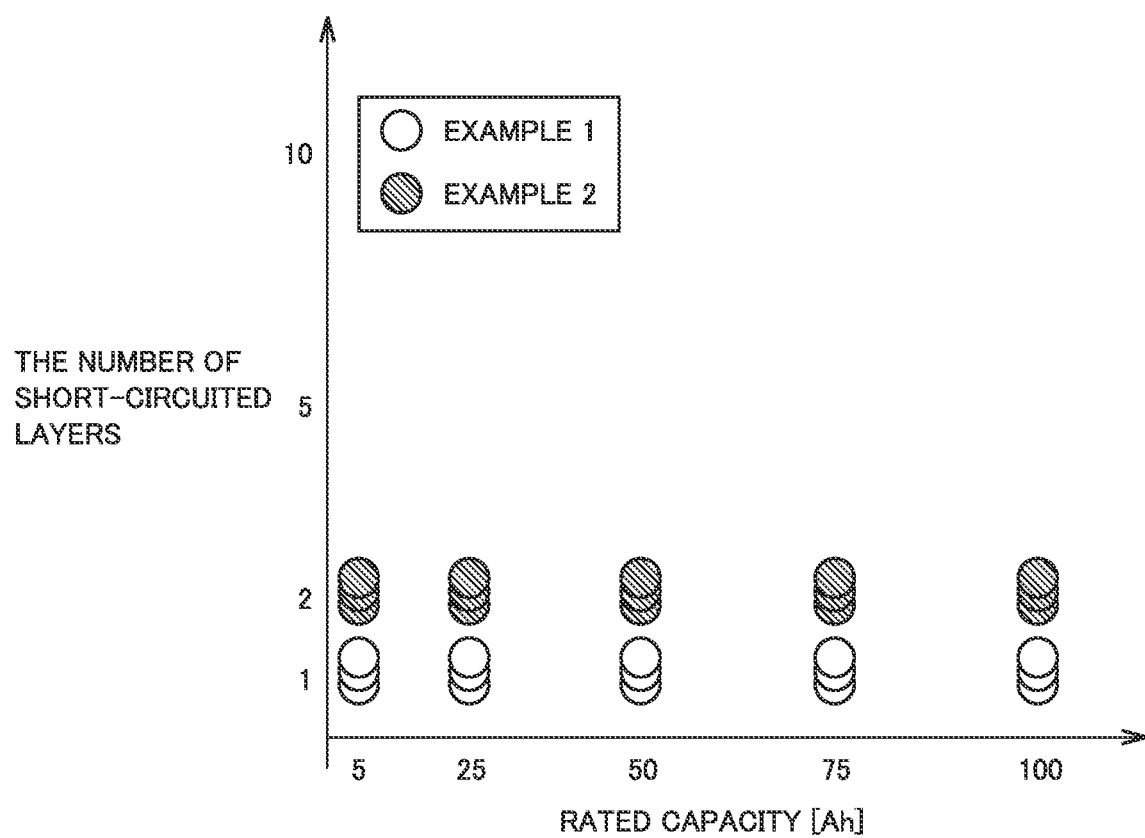
FIG. 24 is a graph showing relation between a rated capacity of a power storage device and the number of short-circuited layers in Examples 1 and 2.

FIG. 24 is a graph showing relation between a rated capacity of a power storage device and the number of short-circuited layers in Examples 1 and 2.

In Examples 1 and 2, the target number of short-circuited layers (one or two) is realized in a stable manner. In Examples 1 and 2, it is considered that the number of short-circuited layers could be controlled.

As shown in FIG. 20 (Example 1) and FIG. 21 (Example 2), in Examples 1 and 2, as the rated capacity is higher, the first potential difference ($\Delta V1$), that is, a voltage of first power storage device 101, is higher after the nail was stopped. Lowering in voltage owing to short-circuiting is considered as being less as the rated capacity is higher, because the number of short-circuited layers is constant regardless of the rated capacity.

<Experiment 2. Reference Electrode>

In Experiment 1 (Examples 1 and 2), it was confirmed that the number of short-circuited layers could be controlled when the outermost electrode was different from the reference electrode. In Experiment 2 (Example 3), whether or not the number of short-circuited layers could be controlled was checked when the outermost electrode was identical to the reference electrode.

Example 3

First power storage device 101 identical in specifications to Experiment 1 was prepared. Negative electrode 20 was selected as the reference electrode. Namely, the outermost electrode (negative electrode 20) was identical to the reference electrode. Except for this aspect, operations the same as in Example 1 were performed.

Figure 25:
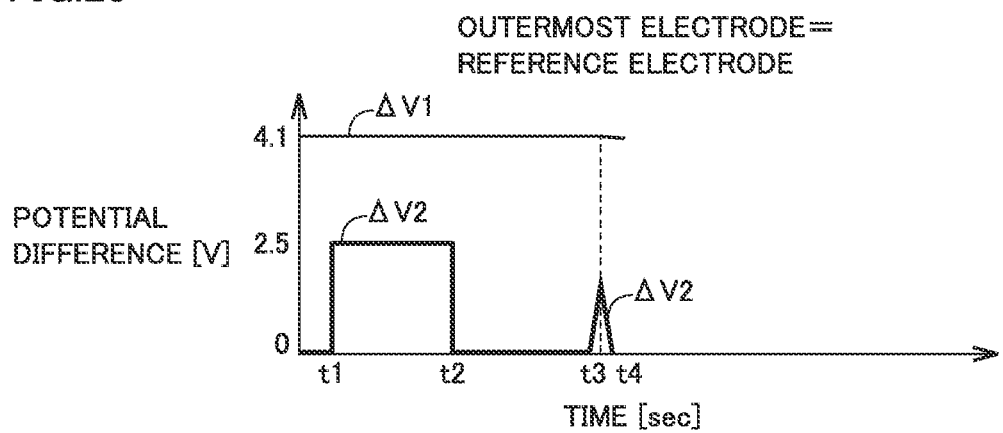
FIG. 25 is a graph showing transition of a potential difference in Example 3.

FIG. 25 is a graph showing transition of a potential difference in Example 3.

At the first time point (t1), the nail came in contact with first casing 91. The second potential difference ($\Delta V2$) at this time indicated a potential difference (2.5 V) between first casing 91 and negative electrode 20.

At the second time point (t2), the nail came in contact with the outermost electrode (negative electrode 20). The second potential difference ($\Delta V2$) at this time decreased substantially to 0 V.

At the third time point (t3), the nail passed through negative electrode 20 and separator 30 and came in contact with positive electrode 10. The second potential difference ($\Delta V2$) increased at this time. At the third time point (t3), the nail was stopped.

While the nail remained stopped, decrease (reversal) in second potential difference ($\Delta V2$) was detected. At the fourth time point (t4), the second potential difference ($\Delta V2$) decreased substantially to 0 V.

<<Results in Experiment 2>>

Wound electrode assembly 158 was disassembled, and it was confirmed that the number of short-circuited layers was one also in Experiment 2. When the outermost electrode is identical to the reference electrode as well, short-circuiting between single layers could be realized. Therefore, it is considered that the number of short-circuited layers can be controlled also when the outermost electrode is identical to the reference electrode.

Example 3, however, was smaller than Example 1 in amount of variation in second potential difference ($\Delta V2$) with short-circuiting between single layers. It is expected that, when an electrode different from the outermost electrode is selected as the reference electrode as in Example 1, an amount of variation in second potential difference ($\Delta V2$) is greater and detection of short-circuiting between single layers is facilitated.

Alternatively, this result is also understood as the amount of variation in second potential difference ($\Delta V2$) being smaller due to selection of negative electrode 20 as the reference electrode. Therefore, it is expected that, when positive electrode 10 is selected as the reference electrode, an amount of variation in second potential difference ($\Delta V2$) is greater and detection of short-circuiting between single layers is facilitated.

<Experiment 3. Potential of Casing>

In Experiments 1 and 2, first casing 91 has a neutral potential. In Experiments 1 and 2, transition of the second potential difference ($\Delta V2$) was observed while first casing 91 was insulated from positive electrode 10 and negative electrode 20.

In Experiment 3, transition of the second potential difference ($\Delta V2$) was observed when first casing 91 was equal to positive electrode 10 in potential (first casing 91 was electrically connected to positive electrode 10) and when first casing 91 was equal to negative electrode 20 in potential (first casing 91 was electrically connected to negative electrode 20). Transition of the second potential difference (ΔV2) was checked in each of an example in which positive electrode 10 was selected as the reference electrode and an example in which negative electrode 20 was selected as the reference electrode. Table 2 below shows results.

In Table 2 below, "P (positive)" means that transition of the second potential difference (ΔV2) was stable and detection of decrease or increase in second potential difference (ΔV2) was easy. "N (negative)" means that transition of the second potential difference (ΔV2) was unstable.

TABLE 2

| | Potential of Casing | |
|---|---|---|
| | Reference Electrode | |
| Potential of Casing | Positive Electrode | Negative Electrode |
| Neutral Potential (Experiments 1 and 2) | P | P |
| Potential Equal to Positive Electrode | N | N |
| Potential Equal to Negative Electrode | P | N |

<<Results in Experiment 3>>

As shown in Table 2, when first casing 91 had the neutral potential, transition of the second potential difference (ΔV2) was stable regardless of whether positive electrode 10 or negative electrode 20 was selected as the reference electrode.

When first casing 91 was equal in potential to positive electrode 10, transition of the second potential difference (ΔV2) was unstable regardless of whether positive electrode 10 or negative electrode 20 was selected as the reference electrode. Therefore, when first casing 91 is equal in potential to positive electrode 10, wound electrode assembly 158 may be taken out of first casing 91 to evaluate first power storage device 101.

When first casing 91 was equal to negative electrode 20 in potential and when positive electrode 10 was selected as the reference electrode, it was confirmed that transition of the second potential difference (ΔV2) tended to be stable. Therefore, it is considered that, when first casing 91 is equal to negative electrode 20 in potential, positive electrode 10 is desirably selected as the reference electrode.

<Experiment 4. Diameter (φ) of Rod-Shaped Member>

In Experiment 4, a diameter (φ) of rod-shaped member 1 (nail) was studied.

A nail having a diameter (φ) in Table 3 below was prepared. Whether or not the nail could pass through the casing was checked under conditions below. Table 3 below shows results. "P" in Table 3 below means that the nail passed through the casing. "N" means that the nail could not pass through the casing.

<<Conditions in Experiment 4>>
Angle (θ) at tip end of nail: 45 degrees
Shape of nail: round nail (nail having a circular cross-sectional shape in a cross-section orthogonal to the axial direction)
Rate of insertion: 0.01 mm/second

TABLE 3

| Diameter of Rod-Shaped Member | | | | |
|---|---|---|---|---|
| Casing | | Diameter (φ) of Rod-Shaped Member | | |
| Material | Wall Thickness | 1 mm | 3 mm | 5 mm |
| Al | 0.7 mm | N | P | P |
| Al | 1.4 mm | N | P | P |
| SUS | 0.7 mm | N | P | P |
| Aluminum Laminate Film | — | P | P | P |

<<Results in Experiment 4>>

As shown in Table 3, when the casing is made of a hard material and when rod-shaped member 1 has a small diameter (φ), rod-shaped member 1 may be bent and rod-shaped member 1 may not be able to pass through the casing.

<Experiment 5. Angle (θ) at Tip End of Rod-Shaped Member>

In Experiment 5, an angle (θ) at the tip end of rod-shaped member 1 was studied.

A nail having an angle (θ) at the tip end in Table 4 below was prepared. Whether or not the nail could pass through the casing was checked under conditions below. Table 4 below shows results. "Penetration: P" in Table 4 below means that the nail passed through the casing. "Penetration: N" means that the nail could not pass through the casing. "Collapse: P" means that the tip end of the nail did not collapse. "Collapse: N" means that the tip end of the nail collapsed.

<<Conditions in Experiment 5>>
Diameter (φ) of nail: 3 mm (round nail)
Rate of insertion: 0.01 mm/second

TABLE 4

| Angle at Tip End of Rod-Shaped Member | | | | | |
|---|---|---|---|---|---|
| Casing | | Angle (θ) at Tip End of Rod-Shaped Member | | | |
| Material | Wall Thickness | 10 Degrees | 20 Degrees | 30 Degrees | 90 Degrees |
| Al | 0.7 mm | Penetration: N Collapse: N | Penetration: P Collapse: N | Penetration: P Collapse: P | Penetration: P Collapse: P |
| Al | 1.4 mm | Penetration: N Collapse: N | Penetration: P Collapse: N | Penetration: P Collapse: N | Penetration: P Collapse: P |
| SUS | 0.7 mm | Penetration: N Collapse: N | Penetration: P Collapse: N | Penetration: P Collapse: N | Penetration: P Collapse: P |
| Aluminum Laminate Film | — | Penetration: P Collapse: P | Penetration: P Collapse: P | Penetration: P Collapse: P | Penetration: P Collapse: P |

<<Results in Experiment 5>>

As shown in Table 4, when the casing is made of a hard material, with the tip end of rod-shaped member 1 being excessively sharp, the tip end may collapse and rod-shaped member 1 may not be able to pass through the casing.

<Experiment 6: Condition for Stop>

In Experiment 6, a condition for stopping rod-shaped member 1 (nail) was studied.

A nail was inserted into first power storage device 101 under conditions below. Relation between a time period elapsed since the time point when an amount of decrease in second potential difference (ΔV2) exceeded the threshold value shown in Table 5 below until the time point of actual stop of the nail and the number of short-circuited layers was examined. Table 5 below shows results.

<<Conditions in Experiment 6>>

Reference electrode: positive electrode 10 (the outermost electrode being different from the reference electrode)

Angle (θ) at tip end of nail: 45 degrees

Diameter (φ) of nail: 3 mm (round nail)

Rate of insertion: 0.1 mm/second

TABLE 5

| | Condition for Stop | | | | | | |
|---|---|---|---|---|---|---|---|
| Threshold Value (Amount of Decrease in ΔV2) | 0 mV | 10 mV | 10 mV | 50 mV | 50 mV | 100 mV | 100 mV |
| Time Period Elapsed Since Time Point of Going Beyond Threshold Value Until Time Point of Stop of Nail | 10 seconds | 10 seconds | 50 seconds | 10 seconds | 50 seconds | 10 seconds | 50 seconds |
| The Number of Short-Circuited Layers | 0 | 0 to 1 | 0 to 1 | 1 to 2 | 1 to 3 | 1 to 2 | 1 to 3 |

<<Results in Experiment 6>>

As shown in Table 5, no short-circuiting occurs when the threshold value is set to 0 mV. When the threshold value is set to 10 mV, short-circuiting may not occur. When the threshold value is set to 10 mV, short-circuiting may erroneously be detected due to noise. When the threshold value is set to 50 mV, the number of short-circuited layers is from one to two. When the threshold value is set to 50 mV, a result comparable to that in the forced internal short circuit test is expected. When a time period elapsed until the nail stops is longer, the number of short-circuited layers tends to increase.

<Experiment 7. Rate of Insertion>

In Experiment 7, a rate of insertion of rod-shaped member 1 (nail) was studied.

The nail was inserted into first power storage device 101 under conditions below. Relation between the rate of insertion and the number of short-circuited layers was examined. Table 6 below shows results.

<<Conditions in Experiment 7>>

Reference electrode: positive electrode 10 (the outermost electrode being different from the reference electrode)

Angle (θ) at tip end of nail: 45 degrees

Diameter (φ) of nail: 3 mm (round nail)

Threshold value: 50 mV

TABLE 6

| | Rate of Insertion | | | | |
|---|---|---|---|---|---|
| | Rate of Insertion | | | | |
| | 10 mm/ second | 1 mm/ second | 0.1 mm/ second | 0.01 mm/ second | 0.001 mm/ second |
| The Number of Short-Circuited Layers | 5 | 2 | 1 | 1 | 1 |

<<Results in Experiment 7>>

As shown in Table 6, as the rate of insertion is higher, the number of short-circuited layers tends to increase. Control of the number of short-circuited layers is considered as being easier as the rate of insertion is lower.

The embodiments disclosed herein are illustrative and non-restrictive in every respect. The technical scope defined by the terms of the claims includes any modifications within the scope and meaning equivalent to the terms of the claims.

What is claimed is:

1. A method of evaluating an all-solid-state battery comprising at least:

preparing a power storage device, the power storage device including at least a housing and an electrode assembly, the electrode assembly being accommodated in the housing, the electrode assembly including a positive electrode and a negative electrode, at least one positive electrode and at least one negative electrode being alternately stacked to form a stack portion in the electrode assembly;

adjusting a charge level of the all-solid-state battery to produce a first potential difference between the positive electrode and the negative electrode;

selecting the positive electrode or the negative electrode as a reference electrode;

performing an operation to insert a conductive rod-shaped member into the stack portion along a direction of stack of the positive electrode and the negative electrode while a second potential difference between the reference electrode and the rod-shaped member is measured after the charge level is adjusted;

stopping the rod-shaped member; and evaluating the all-solid-state battery based on a state of the all-solid-state battery after the rod-shaped member is stopped, when an electrode with which the rod-shaped member comes in contact first in the stack portion is different from the reference electrode, the operation to insert the rod-shaped member being controlled to stop the rod-shaped member when a decrease in absolute value of the second potential difference is detected at least once, and when the electrode with which the rod-shaped member comes in contact first in the stack portion is identical to the reference electrode, the operation to insert the rod-shaped member being controlled to stop the rod-shaped member when an increase in the absolute value of the second potential difference is detected at least once.

2. The method of evaluating the all-solid-state battery according to claim 1, wherein
the rod-shaped member is inserted into the stack portion from outside of the housing.

3. The method of evaluating the all-solid-state battery according to claim 1, wherein
the positive electrode is selected as the reference electrode.

4. The method of evaluating the all-solid-state battery according to claim 1, wherein
the electrode with which the rod-shaped member comes in contact first in the stack portion is different from the reference electrode.

5. The method of evaluating the all-solid-state battery according to claim 4, the method further comprising evaluating the all-solid-state battery by detecting increase in the absolute value of the second potential difference while the rod-shaped member remains stopped after the rod-shaped member is stopped.

6. The method of evaluating the all-solid-state battery according to claim 5, the method further comprising evaluating the all-solid-state battery based on a time period elapsed since a time point of stop of the rod-shaped member until a time point of increase in the absolute value of the second potential difference.

7. The method of evaluating the all-solid-state battery according to claim 4, wherein
the operation to insert the rod-shaped member is controlled to stop the rod-shaped member when decrease in the absolute value of the second potential difference is detected a plurality of times.

8. The method of evaluating the all-solid-state battery according to claim 1, wherein
the electrode with which the rod-shaped member comes in contact first in the stack portion is identical to the reference electrode.

9. The method of evaluating the all-solid-state battery according to claim 8, the method further comprising evaluating the all-solid-state battery by detecting decrease in the absolute value of the second potential difference while the rod-shaped member remains stopped after the rod-shaped member is stopped.

10. The method of evaluating the all-solid-state battery according to claim 9, the method further comprising evaluating the all-solid-state battery based on a time period elapsed since a time point of stop of the rod-shaped member until a time point of decrease in the absolute value of the second potential difference.

11. The method of evaluating the all-solid-state battery according to claim 8, wherein
the operation to insert the rod-shaped member is controlled to stop the rod-shaped member when increase in the absolute value of the second potential difference is detected a plurality of times.

12. A method of manufacturing an all-solid-state battery comprising at least:
manufacturing a plurality of the all-solid-state batteries; and
evaluating one or more of the plurality of the all-solid-state batteries by the method of the all-solid-state battery according to claim 1.

13. A test system for evaluating an all-solid-state batteries, the all-solid-state battery including at least a housing and an electrode assembly, the electrode assembly being accommodated in the housing, the electrode assembly including a positive electrode and a negative electrode, at least one positive electrode and at least one negative electrode being alternately stacked to form a stack portion in the electrode assembly, the test system comprising at least:
a drive device;
a voltage measurement device; and
a control device,
the drive device being configured to perform an operation to insert a conductive rod-shaped member into the stack portion along a direction of stack of the positive electrode and the negative electrode,
the voltage measurement device being configured to measure a potential difference between a reference electrode and the rod-shaped member,
the positive electrode or the negative electrode being selected as the reference electrode,
the control device being configured to carry out at least one of first control and second control,
in the first control, when an electrode with which the rod-shaped member comes in contact first in the stack portion is different from the reference electrode, the operation to insert the rod-shaped member by the drive device being controlled to stop the rod-shaped member when a decrease in absolute value of the potential difference is detected at least once, and
in the second control, when the electrode with which the rod-shaped member comes in contact first in the stack portion is identical to the reference electrode, the operation to insert the rod-shaped member by the drive device being controlled to stop the rod-shaped member when an increase in the absolute value of the potential difference is detected at least once.

* * * * *